United States Patent
Meixner et al.

(10) Patent No.: US 11,706,010 B1
(45) Date of Patent: Jul. 18, 2023

(54) METHODS AND APPARATUS FOR PROVIDING REDUNDANT NETWORKING CAPABILITIES FOR TELEOPERATIONS

(71) Applicant: Nuro, Inc., Mountain View, CA (US)

(72) Inventors: Albert Meixner, Mountain View, CA (US); Zhan Xiong Chin, Sunnyvale, CA (US); Young Jean (Albert) Han, Sunnyvale, CA (US)

(73) Assignee: Nuro, Inc., Mountain View, CA (US)

( * ) Notice: Subject to any disclaimer, the term of this patent is extended or adjusted under 35 U.S.C. 154(b) by 181 days.

(21) Appl. No.: 16/951,067

(22) Filed: Nov. 18, 2020

Related U.S. Application Data

(60) Provisional application No. 62/954,983, filed on Dec. 30, 2019.

(51) Int. Cl.
| | | |
|---|---|---|
| *H04L 5/06* | (2006.01) | |
| *H04L 1/1607* | (2023.01) | |
| *H04W 4/46* | (2018.01) | |
| *H04L 5/00* | (2006.01) | |
| *H04W 4/38* | (2018.01) | |
| *H04W 4/44* | (2018.01) | |

(52) U.S. Cl.
CPC .......... *H04L 5/0064* (2013.01); *H04L 1/1607* (2013.01); *H04L 5/0053* (2013.01); *H04W 4/38* (2018.02); *H04W 4/44* (2018.02); *H04W 4/46* (2018.02)

(58) Field of Classification Search
USPC ........................................................ 370/329
See application file for complete search history.

(56) References Cited

U.S. PATENT DOCUMENTS

| | | | |
|---|---|---|---|
| 10,623,734 B1 | 4/2020 | Shen et al. | |
| 2007/0263818 A1* | 11/2007 | Sumioka | H04L 65/4076 |
| | | | 379/201.01 |
| 2010/0154016 A1* | 6/2010 | Li | H04N 21/6543 |
| | | | 725/111 |
| 2011/0267452 A1 | 11/2011 | Notsu et al. | |
| 2015/0071140 A1 | 3/2015 | Tarighat Mehrabani et al. | |
| 2015/0326941 A1 | 11/2015 | Gao et al. | |
| 2016/0323620 A1 | 11/2016 | Kim et al. | |
| 2017/0357528 A1* | 12/2017 | Puranik | H04L 49/70 |
| 2018/0020334 A1* | 1/2018 | Karlsson | H04B 7/0413 |
| 2018/0092113 A1* | 3/2018 | Negoto | H04L 12/4641 |
| 2018/0279175 A1* | 9/2018 | Gholmieh | H04W 4/44 |

(Continued)

*Primary Examiner* — Gregory B Sefcheck
*Assistant Examiner* — Majid Esmaeilian

(57) ABSTRACT

According to one aspect, a method includes identifying a first signal, which carries or otherwise includes data, to be provided to a system by a vehicle. The method includes determining a first amount of bandwidth, the first amount of bandwidth being associated with the signal, determining a second amount of bandwidth, the second amount of bandwidth being an available bandwidth associated with a plurality of modems included on the vehicle to enable the vehicle to communicate with the system, and dividing the first signal into a first plurality of portions based at least on the first amount of bandwidth and the second amount of bandwidth. The first plurality of portions is provided to the plurality of modems for transmission from the vehicle to the system, and is transmitted to the system using the plurality of modems and a plurality of channels associated with the plurality of modems.

21 Claims, 21 Drawing Sheets

(56) References Cited

U.S. PATENT DOCUMENTS

2019/0045569 A1* 2/2019 Abedini ............... H04W 76/18
2019/0320328 A1 10/2019 Magzimof et al.
2021/0194629 A1* 6/2021 Shellhammer ....... H04B 7/0689

* cited by examiner

US 11,706,010 B1

METHODS AND APPARATUS FOR PROVIDING REDUNDANT NETWORKING CAPABILITIES FOR TELEOPERATIONS

TECHNICAL FIELD

The disclosure relates to autonomous vehicles. More particularly, the disclosure relates to providing redundant networks that facilitate the monitoring and operation of the autonomous vehicles by remote human operators.

BACKGROUND

As the use of autonomous vehicles proliferates, the ability for the autonomous vehicles to operate safely is becoming increasingly important. Some autonomous vehicle platforms utilize remote systems, e.g., fleet management systems, with which autonomous vehicles communicate. When communications between autonomous vehicles and remote systems are unreliable, the safety with which the autonomous vehicles operate may be compromised.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

Figure 1:
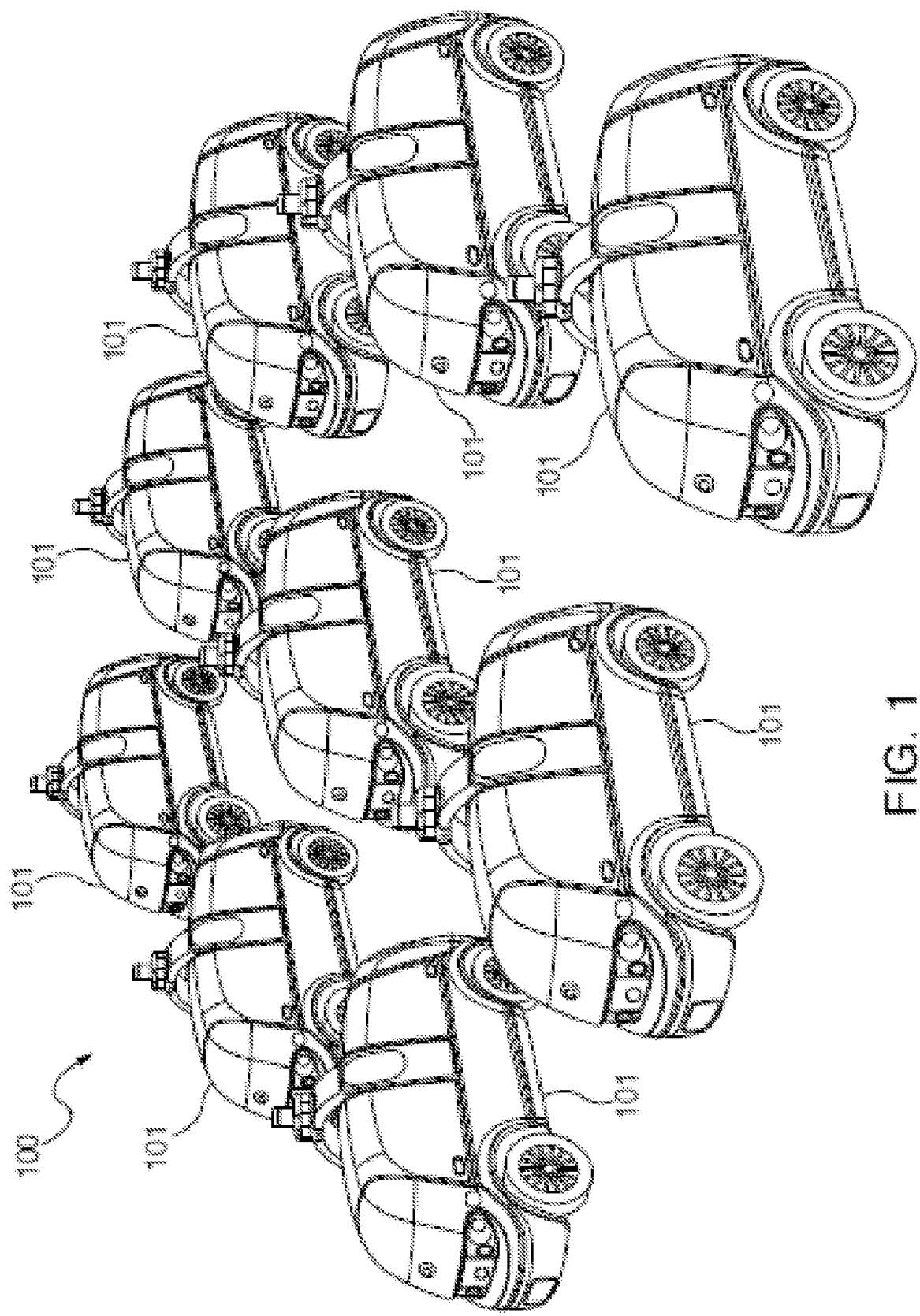
FIG. 1 is a diagrammatic representation of an autonomous vehicle fleet in accordance with an embodiment.

In one embodiment, a method includes identifying a first signal, which carries or otherwise includes data, to be provided to a system by a vehicle. The method includes determining a first amount of bandwidth, the first amount of bandwidth being associated with the signal, determining a second amount of bandwidth, the second amount of bandwidth being an available bandwidth associated with a plurality of modems included on the vehicle to enable the vehicle to communicate with the system, and dividing the first signal into a first plurality of portions based at least on the first amount of bandwidth and the second amount of bandwidth. The first plurality of portions is provided to the plurality of modems for transmission from the vehicle to the system, and is transmitted to the system using the plurality of modems and a plurality of channels associated with the plurality of modems. In one embodiment, the vehicle is an autonomous or semi-autonomous vehicle, and the system is a teleoperations system which is arranged to remotely operate the vehicle.

In another embodiment, a vehicle includes at least one sensor configured to capture data associated with the vehicle, a plurality of modems, an allocation arrangement, and an assessment arrangement. The plurality of modems is associated with a plurality of channels, wherein each modem of the plurality of modems is configured to allow the vehicle to communicate wirelessly with a teleoperations system over an associated channel of the plurality of channels. The allocation arrangement is configured to allocate a signal that includes the data for transmission to the teleoperations system, wherein the allocation arrangement is configured to allocate the signal by dividing the signal into a first plurality of portions and wherein the plurality of modems is arranged to provide the first plurality of portions to the plurality of channels for transmission to the teleoperations system. The assessment arrangement configured to determine when a first modem of the plurality of modems has a performance issue, wherein the allocation arrangement is configured to reallocate the signal when it is determined that the first modem has the performance issue.

According to yet another embodiment, a method includes identifying a first signal to be provided to a teleoperations system by a vehicle, dividing the first signal into a first plurality of portions, wherein each portion is associated with a first amount of bandwidth, and providing the first plurality of portions to a plurality of modems for transmission from the vehicle to the teleoperations system. The method also includes transmitting the first plurality of portions to the teleoperations system using the plurality of modems and a plurality of channels. The plurality of channels is associated with the plurality of modems. A determination is made as to whether a first modem of the plurality of modems has obtained a first acknowledgement from the teleoperations system and, when it is determined that the first modem has not obtained the first acknowledgement from the teleoperations system, the first signal is divided into a second plurality of portions, wherein a first portion of the second plurality of portions is associated with a second amount of bandwidth and other portions of the second plurality of portions are associated with a third amount of bandwidth, the second amount of bandwidth being less than the third amount of bandwidth. Finally, the second plurality of portions is transmitted or provided to the teleoperations system using the plurality of modems and the plurality of channels, wherein the first portion is transmitted on a first channel of the plurality of channels, the first channel being associated with the first modem.

In accordance with still another embodiment, a teleoperations system obtains or otherwise receives portions of a signal substantially simultaneously on multiple channels from an autonomous or semi-autonomous vehicle. The teleoperations system may send one or more acknowledgements to the vehicle upon obtaining each portion. Upon obtaining the portions of the signal, the teleoperator system reconstructs the signal if a sufficient number of portions has been obtained to enable a reconstruction of the signal. Once the signal is reconstruction is completed, the signal may effectively be processed by the teleoperations system. In one embodiment, the portions of the signal may be portions of a frame that may be reassembled or reconstructed into the frame, and displayed on a display screen of a teleoperations system.

According to yet another embodiment, a teleoperations system may provide a signal or data to an autonomous or semi-autonomous vehicle using channels associated with multiple modems. A signal to be provided by the teleoperations system may be replicated or otherwise copied such that substantially the same signal is sent to the vehicle on different channels. Upon receiving the signal on more than one channel, the vehicle may select a signal to use or to otherwise process.

Description

Autonomous vehicle platforms often utilize fleet management systems that include systems which allow for the remote operation of autonomous vehicles by operators, such as teleoperations systems. To substantially ensure the safe operation of the autonomous vehicles by remote operators, communications between the autonomous vehicles and the teleoperations systems used by the remote operators are expected to be reliable, e.g., uninterrupted. When communications between autonomous vehicles and remote systems are unreliable, the safety with which the autonomous vehicles operate may be compromised.

By providing redundant systems in an autonomous vehicle to support communications between the autonomous vehicle and a fleet management system or a teleoperations system, data may continue to be sent between the autonomous vehicle and the fleet management system or the teleoperations system even in the event of a failure of one of the redundant systems. In one embodiment, an autonomous vehicle may include multiple cellular modems, e.g., 3G/4G/5G or LTE modems, that are arranged to substantially all be used such that data may be transmitted and received on parallel channels using the multiple modems. The amount of data that is to be transmitted on each channel, or supported by each modem, may be determined based on factors including, but not limited to including, available bandwidth and latency. The allocation or distribution of data across channels may be dynamically varied to account for changes in bandwidth or latency, data transmission costs, and/or changes in the availability of modems. In the event that one modem ceases to function, other modems may continue to remain functional, and data may continue to be transmitted between an autonomous system and a fleet management system or a teleoperations system.

In one embodiment, an autonomous vehicle that is configured to be operated remotely using a teleoperations system includes multiple cellular modems. Information or data from the autonomous vehicle may be provided to the teleoperations system substantially in parallel using the multiple cellular modems. The cellular modems may each be associated with a different service or cellular provider. When the performance of a particular modem is determined to be inadequate, the data or packets to be using the particular modem may instead be reallocated to other modems such that the particular modem is effectively no longer used. When the teleoperations system provides information or data to the autonomous vehicle, as for example in reply to data received from the autonomous vehicle, the teleoperations system may typically provide substantially the same information or data on multiple channels.

An autonomous vehicle which is capable of communicating with a teleoperations system using multiple transmission channels substantially in parallel may generally be a part of a fleet of autonomous vehicles. Referring initially to FIG. 1, an autonomous vehicle fleet will be described in accordance with an embodiment. An autonomous vehicle fleet 100 includes a plurality of autonomous vehicles 101, or robot vehicles. Autonomous vehicles 101 are generally arranged to transport and/or to deliver cargo, items, and/or goods. Autonomous vehicles 101 may be fully autonomous and/or semi-autonomous vehicles. In general, each autonomous vehicle 101 may be a vehicle that is capable of travelling in a controlled manner for a period of time without intervention, e.g., without human intervention. As will be discussed in more detail below, each autonomous vehicle 101 may include a power system, a propulsion or conveyance system, a navigation module, a control system or controller, a communications system, a processor, and a sensor system.

Dispatching of autonomous vehicles 101 in autonomous vehicle fleet 100 may be coordinated by a fleet management module (not shown). The fleet management module may dispatch autonomous vehicles 101 for purposes of transporting, delivering, and/or retrieving goods or services in an unstructured open environment or a closed environment.

Figure 2:
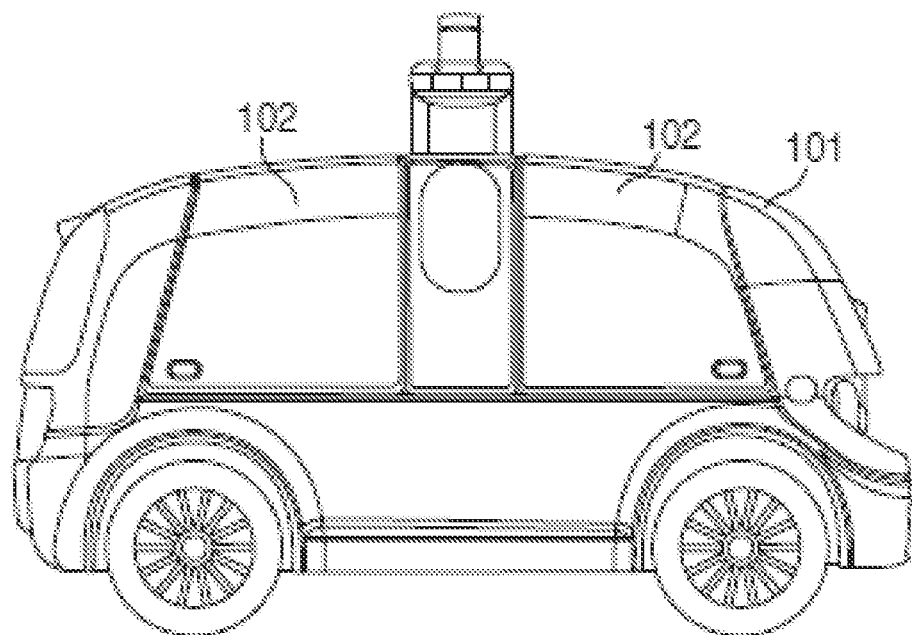
FIG. 2 is a diagrammatic representation of a side of an autonomous vehicle in accordance with an embodiment.

FIG. 2 is a diagrammatic representation of a side of an autonomous vehicle, e.g., one of autonomous vehicles 101 of FIG. 1, in accordance with an embodiment. Autonomous vehicle 101, as shown, is a vehicle configured for land travel. Typically, autonomous vehicle 101 includes physical vehicle components such as a body or a chassis, as well as conveyance mechanisms, e.g., wheels. In one embodiment, autonomous vehicle 101 may be relatively narrow, e.g., approximately two to approximately five feet wide, and may have a relatively low mass and relatively low center of gravity for stability. Autonomous vehicle 101 may be arranged to have a working speed or velocity range of between approximately one and approximately forty-five miles per hour (mph), e.g., approximately twenty-five miles per hour. In some embodiments, autonomous vehicle 101 may have a substantially maximum speed or velocity in range between approximately thirty and approximately ninety mph.

Autonomous vehicle 101 includes a plurality of compartments 102. Compartments 102 may be assigned to one or more entities, such as one or more customer, retailers, and/or vendors. Compartments 102 are generally arranged to contain cargo, items, and/or goods. Typically, compartments 102 may be secure compartments. It should be appreciated that the number of compartments 102 may vary. That is, although two compartments 102 are shown, autonomous vehicle 101 is not limited to including two compartments 102.

Figure 3:
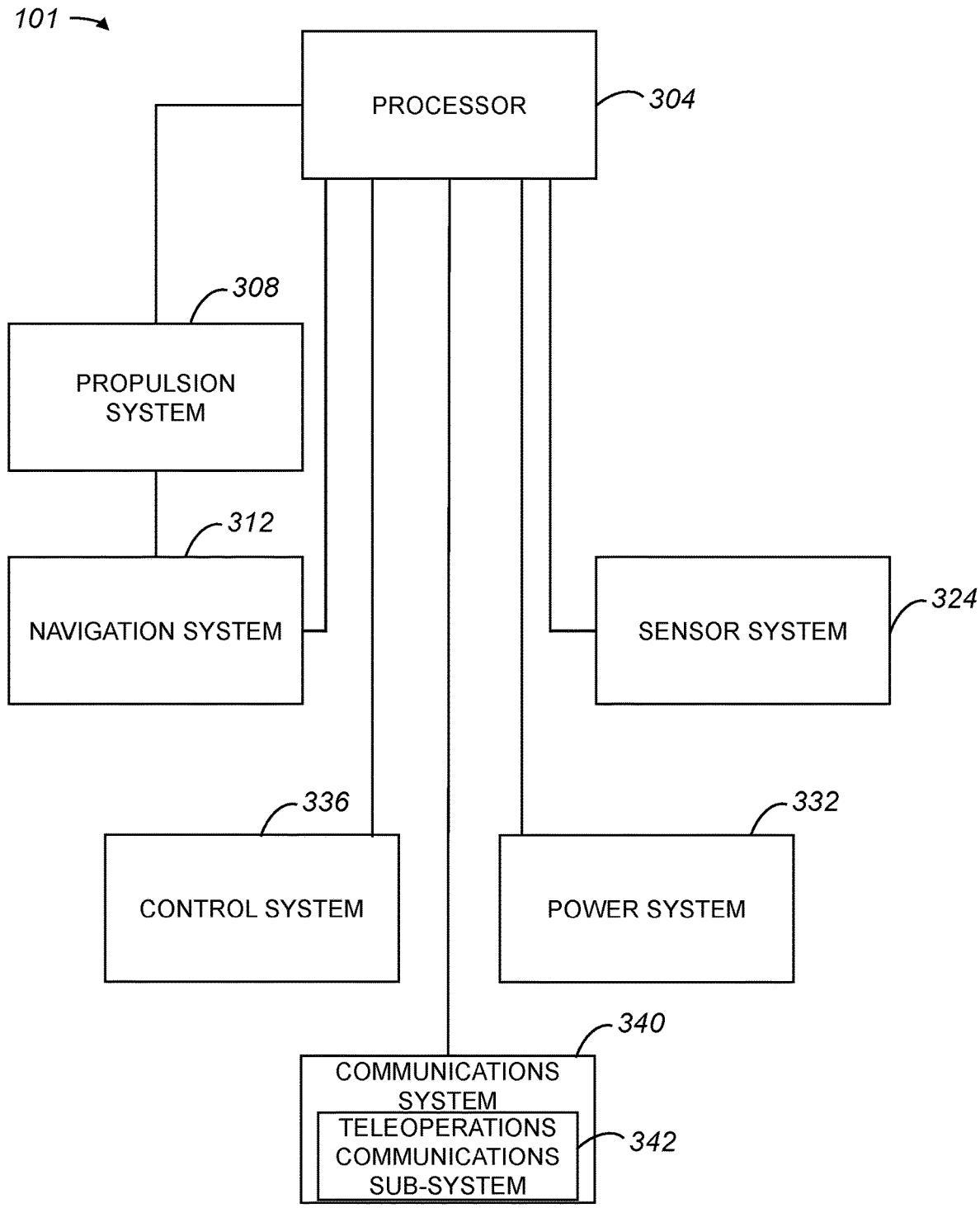
FIG. 3 is a block diagram representation of an autonomous vehicle in accordance with an embodiment.

FIG. 3 is a block diagram representation of an autonomous vehicle, e.g., autonomous vehicle 101 of FIG. 1, in accordance with an embodiment. An autonomous vehicle 101 includes a processor 304, a propulsion system 308, a navigation system 312, a sensor system 324, a power system 332, a control system 336, and a communications system 340. It should be appreciated that processor 304, propulsion system 308, navigation system 312, sensor system 324, power system 332, and communications system 340 are all coupled to a chassis or body of autonomous vehicle 101.

Processor 304 is arranged to send instructions to and to receive instructions from or for various components such as propulsion system 308, navigation system 312, sensor system 324, power system 332, and control system 336. Propulsion system 308, or a conveyance system, is arranged to cause autonomous vehicle 101 to move, e.g., drive. In general, propulsion system 308 propels autonomous vehicle 101 and enables autonomous vehicle 101 to travel. For example, when autonomous vehicle 101 is configured with a multi-wheeled automotive configuration as well as steering, braking systems and an engine, propulsion system 308 may be arranged to cause the engine, wheels, steering, and braking systems to cooperate to drive. In general, propulsion system 308 may be configured as a drive system with a propulsion engine, wheels, treads, wings, rotors, blowers, rockets, propellers, brakes, etc. The propulsion engine may be a gas engine, a turbine engine, an electric motor, and/or a hybrid gas and electric engine.

Navigation system 312 may control propulsion system 308 to navigate autonomous vehicle 101 through paths and/or within unstructured open or closed environments. Navigation system 312 may include at least one of digital maps, street view photographs, and a global positioning system (GPS) point. Maps, for example, may be utilized in cooperation with sensors included in sensor system 324 to allow navigation system 312 to cause autonomous vehicle 101 to navigate through an environment.

Sensor system 324 includes any sensors, as for example LiDAR, radar, ultrasonic sensors, microphones, altimeters, and/or cameras. Sensor system 324 generally includes onboard sensors which allow autonomous vehicle 101 to safely navigate, and to ascertain when there are objects near autonomous vehicle 101. In one embodiment, sensor system 324 may include propulsion systems sensors that monitor drive mechanism performance, drive train performance, and/or power system levels.

Power system 332 is arranged to provide power to autonomous vehicle 101. Power may be provided as electrical power, gas power, or any other suitable power, e.g., solar power or battery power. In one embodiment, power system 332 may include a main power source, and an auxiliary power source that may serve to power various components of autonomous vehicle 101 and/or to generally provide power to autonomous vehicle 101 when the main power source does not does not have the capacity to provide sufficient power.

Communications system 340 allows autonomous vehicle 101 to communicate, as for example, wirelessly, with a fleet management system (not shown) that allows autonomous vehicle 101 to be controlled remotely through teleoperations. Communications system 340 generally obtains or receives data, stores the data, and transmits or provides the data to a fleet management system and/or to autonomous vehicles 101 within a fleet 100. The data may include, but is not limited to including, information relating to scheduled requests or orders, information relating to on-demand requests or orders, and/or information relating to a need for autonomous vehicle 101 to reposition itself, e.g., in response to an anticipated demand. In one embodiment, communications system 340 includes a teleoperations communications sub-system 342. Teleoperations communications sub-system 342 may include multiple modems, e.g., cellular modems such as LTE or 3G/4G/5G modems, that are arranged to cooperate to communicate with a fleet operations system (not shown) such that a teleoperations system of the fleet operations system may monitor and operate autonomous vehicle 101 remotely. It should be appreciated that teleoperations communications sub-system 342 may alternatively, or additionally, communicate substantially directly with a teleoperations system (not shown).

In some embodiments, control system 336 may cooperate with processor 304 to determine where autonomous vehicle 101 may safely travel, and to determine the presence of objects in a vicinity around autonomous vehicle 101 based on data, e.g., results, from sensor system 324. In other words, control system 336 may cooperate with processor 304 to effectively determine what autonomous vehicle 101 may do within its immediate surroundings. Control system 336 in cooperation with processor 304 may essentially control power system 332 and navigation system 312 as part of driving or conveying autonomous vehicle 101. Additionally, control system 336 may cooperate with processor 304 and communications system 340 to provide data to or obtain data from other autonomous vehicles 101, a management server, a global positioning server (GPS), a personal computer, a teleoperations system, a smartphone, or any computing device via the communication module 340. In general, control system 336 may cooperate at least with processor 304, propulsion system 308, navigation system 312, sensor system 324, and power system 332 to allow vehicle 101 to operate autonomously. That is, autonomous vehicle 101 is able to operate autonomously through the use of an autonomy system that effectively includes, at least in part, functionality provided by propulsion system 308, navigation system 312, sensor system 324, power system 332, and control system 336.

An autonomous vehicle may operate in autonomous mode, i.e., the autonomous vehicle may operate autonomously, or the autonomous vehicle may be operated remotely, i.e., a remote human operator may effectively control and/or command the autonomous vehicle. Remotely operating a fully autonomous or a semi-autonomous vehicle, e.g., via teleoperations, may be appropriate in various situations. For example, the capability for a human operator to remotely operate an autonomous vehicle is beneficial even where the autonomous vehicle can be locally operated by a local human operator, especially in situations in which the remote human operator has a better view of upcoming treacherous conditions. The capability for a human operator to remotely operate an autonomous vehicle that may not be locally operated by a local human operator allows the remote human operator to take control of the autonomous vehicle when the remote human operator becomes aware that the autonomous vehicle may be able to head into environment in which it would be preferable for the remote human operator to drive the autonomous vehicle.

Figure 4A:
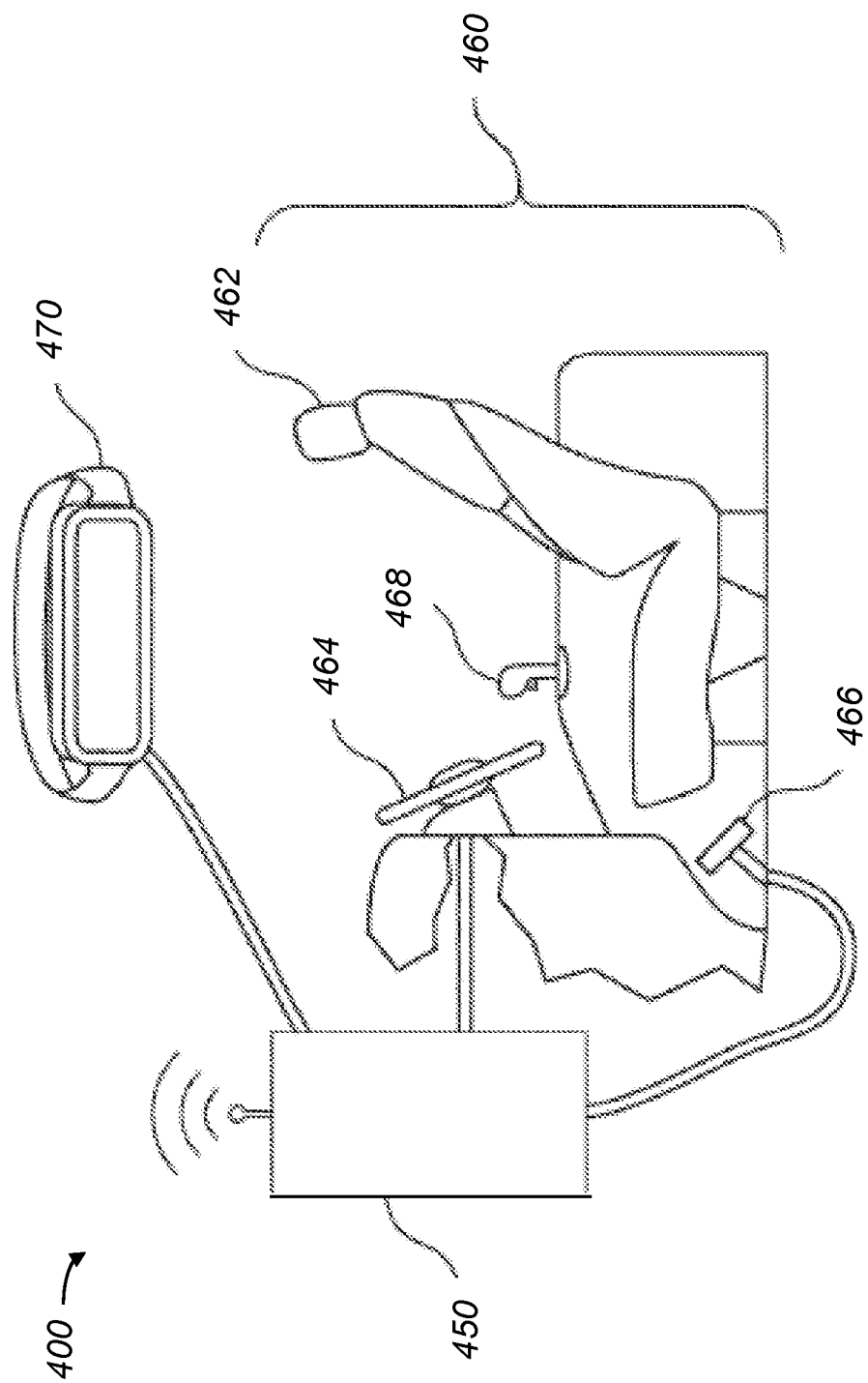
FIG. 4A is a remote human operator system suitable for use in remotely operating a vehicle, e.g., an autonomous vehicle, in accordance with an embodiment.

To enhance the ability of a remote human operator, e.g., a teleoperator, information or data may be provided to a teleoperations system to provide the remote human operator with context associated with an environment in which an autonomous vehicle is operating. The information provided may include, but is not limited to including, images such as still and video images of the surroundings of the autonomous vehicle and/or sounds emanating from the surroundings of the autonomous vehicle. FIG. 4A is a remote human operator system suitable for use in remotely operating a vehicle, e.g., an autonomous vehicle, in accordance with an embodiment. A system 400, which may be a teleoperations system, includes communication/processing equipment 450 and a human operator station 460. The teleoperations system may be part of a fleet management system. Human operator station 460 may resemble, in one embodiment, a driver station in a typical automobile, and may include a driver seat 462, a steering wheel 464, acceleration and brake pedals 466, and a gear shifter 468. Human operator station 460 also includes a visual interface 470 that is configured to allow a human operator to view the environment in which an autonomous vehicle that is to be driven or otherwise controlled by human operator station 460 is driving.

In one embodiment, visual interface 470 is in the form of a virtual-reality (VR) or augmented-reality (AR) headset. Visual interface 470 is not limited, however, to being a VR or an AR headset. By way of example, visual interface 470 may include one or more display screens. Display screens may be LED, LCD, and/or OLED display screens. Visual interface 470 may be configured to provide any number of different views of the environment in which the autonomous vehicle is driving. Such views may include, but are not limited to including, front views, side views, and/or rear views.

Human operator station 460 may be configured to have the approximate touch response of an actual driver station in an automobile. For example, steering wheel 464 may be configured to have a touch response that is similar to that of power steering in an actual automobile, and pedals 466 may be configured to approximate the resistance of pedals in an actual automobile.

Steering wheel 464, acceleration and brake pedals 466, and gear shifter 468 may be connected to or otherwise coupled to communication/processing equipment 450. Communication/processing equipment 450 enables communication between human operator station 460 and the autonomous vehicle that is configured to be remotely operated using human operator station 460. As shown, human operator station 460 may be connected to communication/processing equipment 450 by physical cables and connections. It should be appreciated, however, that human operator station 460 may instead be wirelessly coupled to communication/processing equipment 450 using any suitable method including, but not limited to including, Bluetooth and Wi-Fi. In addition, while human operator station 460 may be substantially directly connected to communication/processing equipment 450, human operator station 460 may instead be coupled to communication/processing equipment 450 through intermediate devices and/or networks, e.g., wireless and/or cellular networks.

Communication/processing equipment 450 may establish communications, as for example communications with an autonomous vehicle and/or with visual interface 470, using various communications technologies including, but not limited to including, IEEE 802.11x (Wi-Fi), cellular 3G/4G/5G, wired communications, and/or other wired or wireless communication protocols. It should be appreciated that communication/processing equipment 450 generally includes one or more processors, memories, machine instructions, and/or hardware for processing visual information for display by the visual interface 470. Substantially any suitable method may be used to communicate, to process, and to display visual information.

Communication/processing equipment 450 is generally arranged to process signals from human operator station 460, and to translate the signals into control instructions for controlling an autonomous vehicle. In one embodiment, communication/processing equipment 450 is arranged to provide teleoperations capabilities. The signals provided by communication/processing equipment 450 may include control instructions for controlling a conveyance system of the autonomous vehicle to cause the autonomous vehicle to drive or to otherwise travel.

When a human operator turns or steers steering wheel 464, communication/processing equipment 450 may send corresponding control instructions to an autonomous vehicle to instruct the autonomous vehicle to turn or to drive in the direction indicated by the way the human operator steers steering wheel 464. In addition, when a human operator accelerates or brakes using pedals 466 of operator station 460, communication/processing equipment 450 sends corresponding control instructions to the autonomous vehicle to instruct the autonomous vehicle to accelerate or brake, respectively.

Figure 4B:
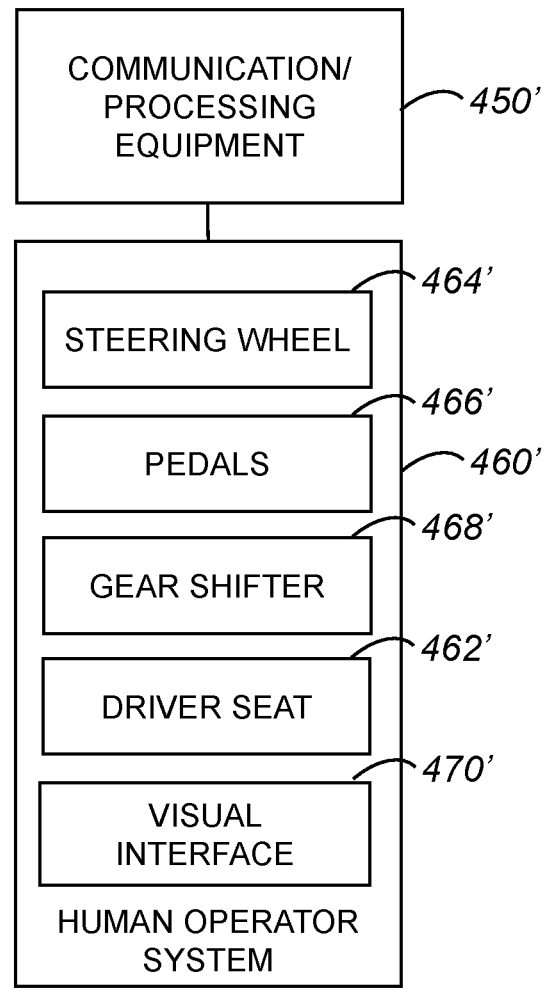
FIG. 4B is a block diagram representation of a remote human operator system, e.g., remote human operator system 400 of FIG. 4A, in accordance with an embodiment.

FIG. 4B is a block diagram representation of one embodiment of operator system 400. As shown in FIG. 4B, operator system 400' may include communication/processing equipment 450' and human operator system 460' which are in communication with each other. Communication/processing equipment 450' may be arranged to receive or to otherwise obtain signals from a vehicle over multiple channels, and to substantially create a composite signal from the signals, e.g., to effectively reconstruct a frame after portions of the frame are obtained from the multiple channels. Communication/processing equipment 450' may also send or otherwise provide signals to a vehicle using the same channels used to receive signals form the vehicle.

Human operator system 460' generally includes controls and other equipment which enable a remote human to drive or to otherwise control a vehicle. Human operator system 460' includes driver seat 462', steering wheel 464', pedals 466', gear shifter 468', and visual interface 470'. Pedals 466' may include an accelerator pedal, e.g., a gas pedal, and a brake. Visual interface 470' may, in one embodiment, include at least one display screen arranged to display images which substantially depict the environment around a vehicle controlled using operator system 400'.

Figure 5:
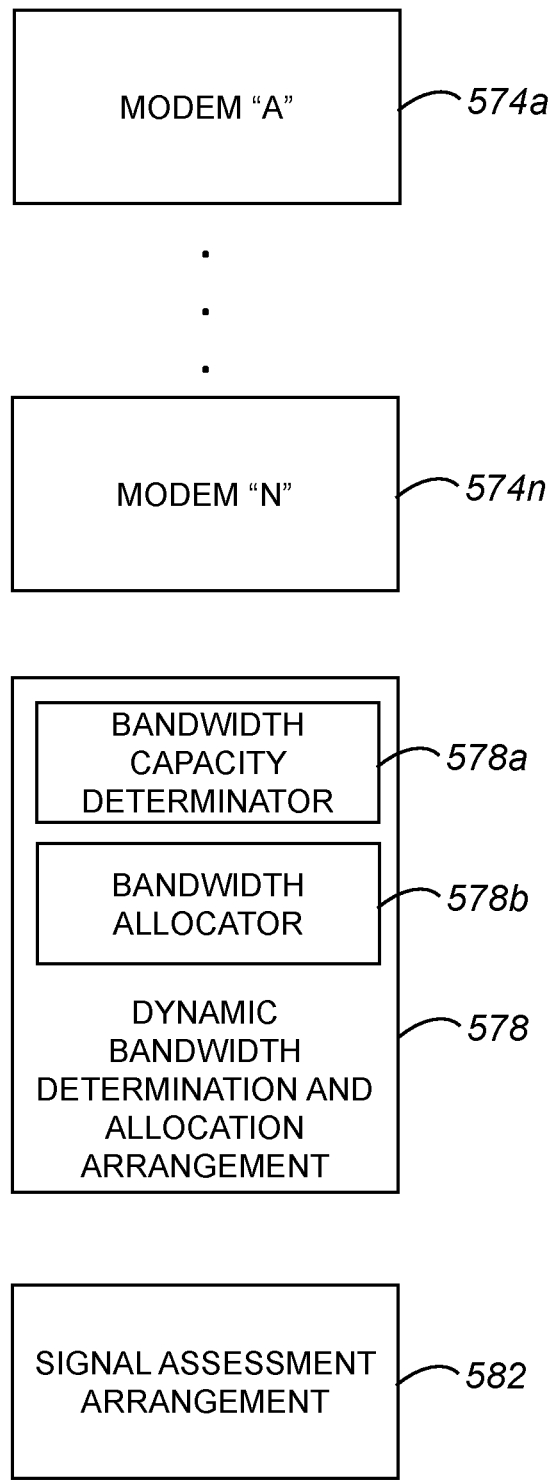
FIG. 5 is a block diagram representation of a communications system, e.g., communications system 340 of FIG. 3, which includes multiple modems in accordance with an embodiment.

As discussed above, the ability to send data, e.g., frames or packets, substantially in parallel using multiple modems between an autonomous vehicle and an operator system of station provides redundancy that protects against the inadequacy or failure of any single modem. When multiple modems and, hence, channels are used to send data, data may continue to be sent and received even if one or more modems ceases to function as expected. With reference to FIG. 5, a communications system of an autonomous vehicle, e.g., communications system 340 of FIG. 3, which includes multiple modems will be described in accordance with an embodiment. Communications system 340 generally includes multiple cellular modems 574a-n, a dynamic bandwidth determination and allocation arrangement 578, and a signal assessment arrangement 582.

Modems 574a-n are generally devices that provide cellular connectivity to an autonomous vehicle, e.g., autonomous vehicle 101 of FIGS. 1-3. In one embodiment, modems 574a-n may provide 3G/4G/5G or LTE cellular connectivity, although it should be appreciated that other types of connectivity may instead or additionally be provided by modems 574a-n. Modems 574a-n may be configured in any suitable form including, but not limited to including, universal serial bus (USB) modules and/or peripheral interconnect (PCI) cards. Further, the number of modems 574a-n included in communications system 340 may vary widely. In general, communications system 340 includes two or more modems 574a-n, each of which may be associated with a different cellular provider or carrier. Each modem 574a-n is associated with one or more channels over which data may be transmitted and received. In one embodiment, communications system 340 may include approximately four modems 547a-n, and each of the four modems 547a-n may be associated one channel.

Dynamic bandwidth determination and allocation arrangement 578 may include hardware and/or software that is configured to determine an amount of bandwidth availability and an amount of data to send via communications system 340 to a system (not shown) such as a teleoperations system, and to determine the available bandwidth associated with each modem 574a-n. Dynamic bandwidth determination and allocation arrangement 578 is further configured to determine which modems 574a-n are to be used to transmit data, e.g., frames of data, and how much of an overall signal, or data, each modem 574a-n is to transmit. Dynamic bandwidth determination and allocation arrangement 578 may periodically determine bandwidth and allocate bandwidth, and/or may also determine and allocate bandwidth as needed, as for example when it is determined that a particular modem 574a-n is not performing as expected.

Dynamic bandwidth determination and allocation arrangement 578 may include, but is not limited to including, a bandwidth capacity determinator 578a and a bandwidth allocator 578b. Bandwidth capacity determinator 578 is configured to determine how much bandwidth is substantially needed to send or to transmit signals, and how much bandwidth may be available on channels associated with modems 574a-n. Bandwidth allocator 578b is arranged to substantially divide bandwidth amongst modems 574a-n such that signals may be sent or transmitted by one or more modems 574a-n It should be understood that bandwidth allocator 578b may substantially divide bandwidth in any suitable manner. For example, bandwidth may be allocated such that packets A, B, C, D, E, F, G, etc. are split amongst modems 574a-n such that modem 574a transmits packets A and B, modem 574b transmits packets C and D, etc. Regardless of how packets may be divided, an error correction technique may be implement such that as long as a number "K" out of a number "N" packets sent are received, an original signal may effectively be reconstructed. As such, the number of packets to send on each modem 574a-n may be considered, rather than considering how packets may actually be allocated or otherwise divided. When a split is non-integer, a proportional random assignment may be used. For instance, if three sequential packets are to be sent on modems 574a, 574b with a 60:40 bandwidth split, a first packet may be sent on modem 574a, a second packet may be sent on modem 574b, and a third packet may be sent on modem 574a such that a probability of approximately eighty percent is associated with modem 574a and a probability of approximately twenty percent is associated with modem 574b.

In one embodiment, dynamic bandwidth determination and allocation arrangement 578 may determine an appropriate amount of total bandwidth needed to transmit data, and the divide the total bandwidth substantially evenly by a number of modems 574a-n and/or channels over which data is to be sent. That is, modems 574a-n and their corresponding channels may substantially evenly split data or decompose data to be sent using modems 574a-n. In general, data may be split among modems 574a-n for each time window. That is, if substantially all modems 574a-n are performing normally or as expected, data may be divided equally among substantially all modems 574a-n. For example, if four modems 574a-n are performing normally or as expected, every camera frame, each of four modems 574a-n may send approximately one-fourth of each camera frame.

Signal assessment arrangement 582 may include hardware and/or software configured to effectively monitor modems 574a-n to determine whether any modems 574a-n appear to be failing or otherwise not performing as expected. By way of example, signal assessment arrangement 582 may determine that a particular modem 574a-n has not received an acknowledgement (ACK) packet that acknowledges the receipt of data within a predetermined amount of time. When signal assessment arrangement 582 identifies a particular modem 574a-n as not functioning as expected, signal assessment arrangement 582 may essentially notify dynamic bandwidth determination and allocation arrangement 578. It should be appreciated that signal assessment arrangement 582 may also determine when the character of a signal has changed, and may effectively cause dynamic bandwidth determination and allocation arrangement 578 to reallocate bandwidth in response to a changed signal.

Figure 6:
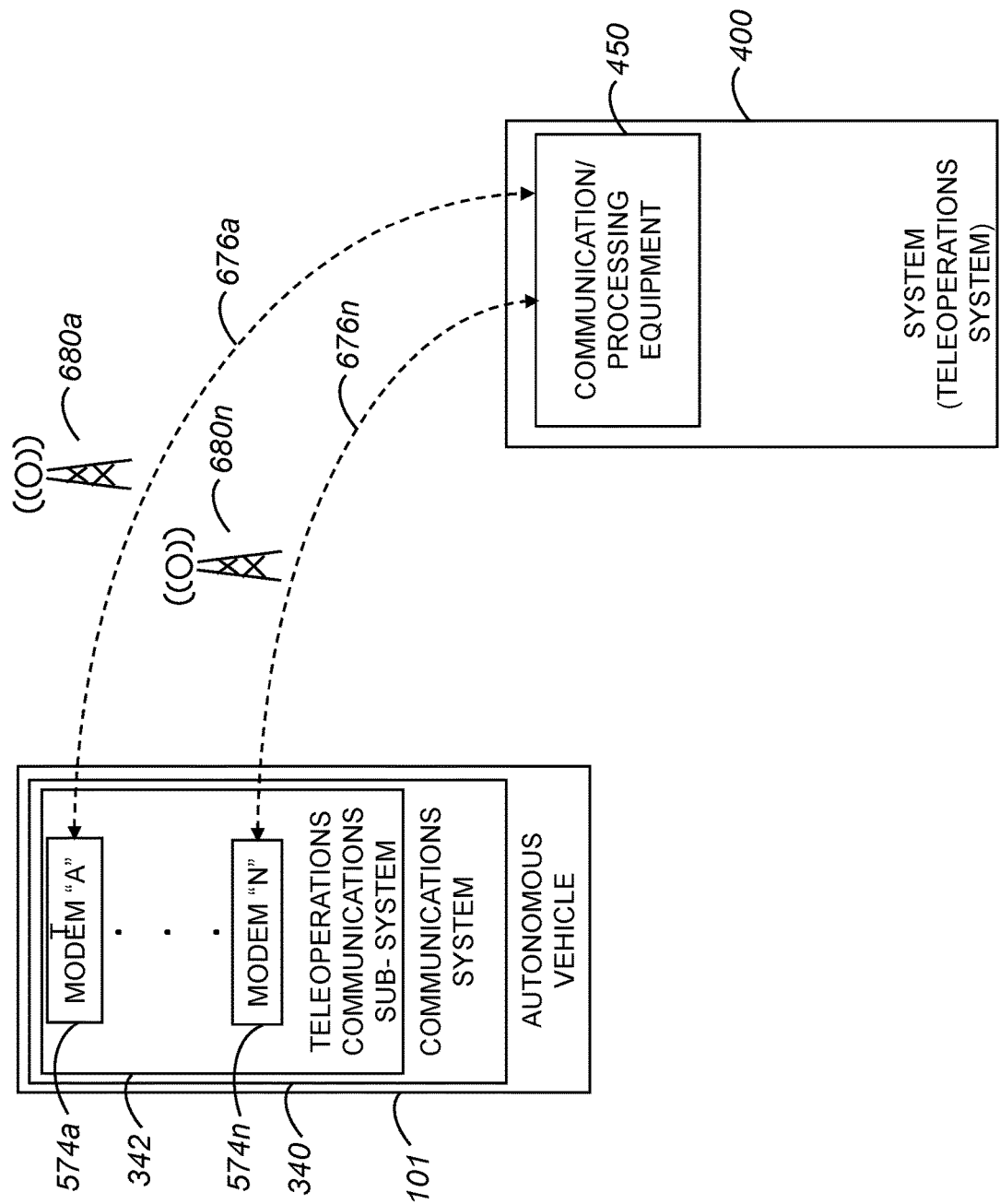
FIG. 6 is a diagrammatic representation of communications between a communications system of an autonomous vehicle, e.g., communications system 340 of FIG. 3, and a system such as a teleoperations system, e.g., system 400 of FIG. 4, in accordance with an embodiment.

Communications system 340 and, hence, teleoperations communications sub-system 342 may communicate with a system such as system 400 of FIG. 4 which allows a human operator to remotely operate an autonomous vehicle 101. FIG. 6 is a diagrammatic representation of communications between a communications system of an autonomous vehicle, e.g., communications system 340 of FIG. 3, and a system such as a teleoperations system, e.g., system 400 of FIG. 4, in accordance with an embodiment. Modems 574a-n each have at least one wireless channel 676a-n, respectively, over which data may be transmitted to system 400 or, more specifically, to communication/processing equipment 450 of system 400. Data may also be received by modems 574a-n over respective wireless channels 676a-n from communication/processing equipment 450. In one embodiment, each wireless channel 676a-n is associated with a different network or provider 676a-n, respectively. For example, each modem 574a-n and its associated channel 676a-n may use a particular cellular network 680a-n, respectively. Channels 676a-n are generally bidirectional, and may be used by modems 574a-n, respectively, to provide an overall signal to, and to receive ACK packets from, communication/processing equipment 450.

In general, an overall signal may effectively be divided such that data, as for example frames or packets, included in the signal are sent substantially in parallel over multiple channels 676a-n. The overall signal may be a video signal or may be a signal that includes autonomy data. A video signal may generally include frames. Once data is received on communication/processing equipment 450, communication/processing equipment 450 may reconstruct the overall signal. In one embodiment, the reconstructed overall signal may be displayed as video on a visual interface or display, e.g., visual interface 470 of FIG. 4A or visual interface 470' of FIG. 4B.

Figure 7A:
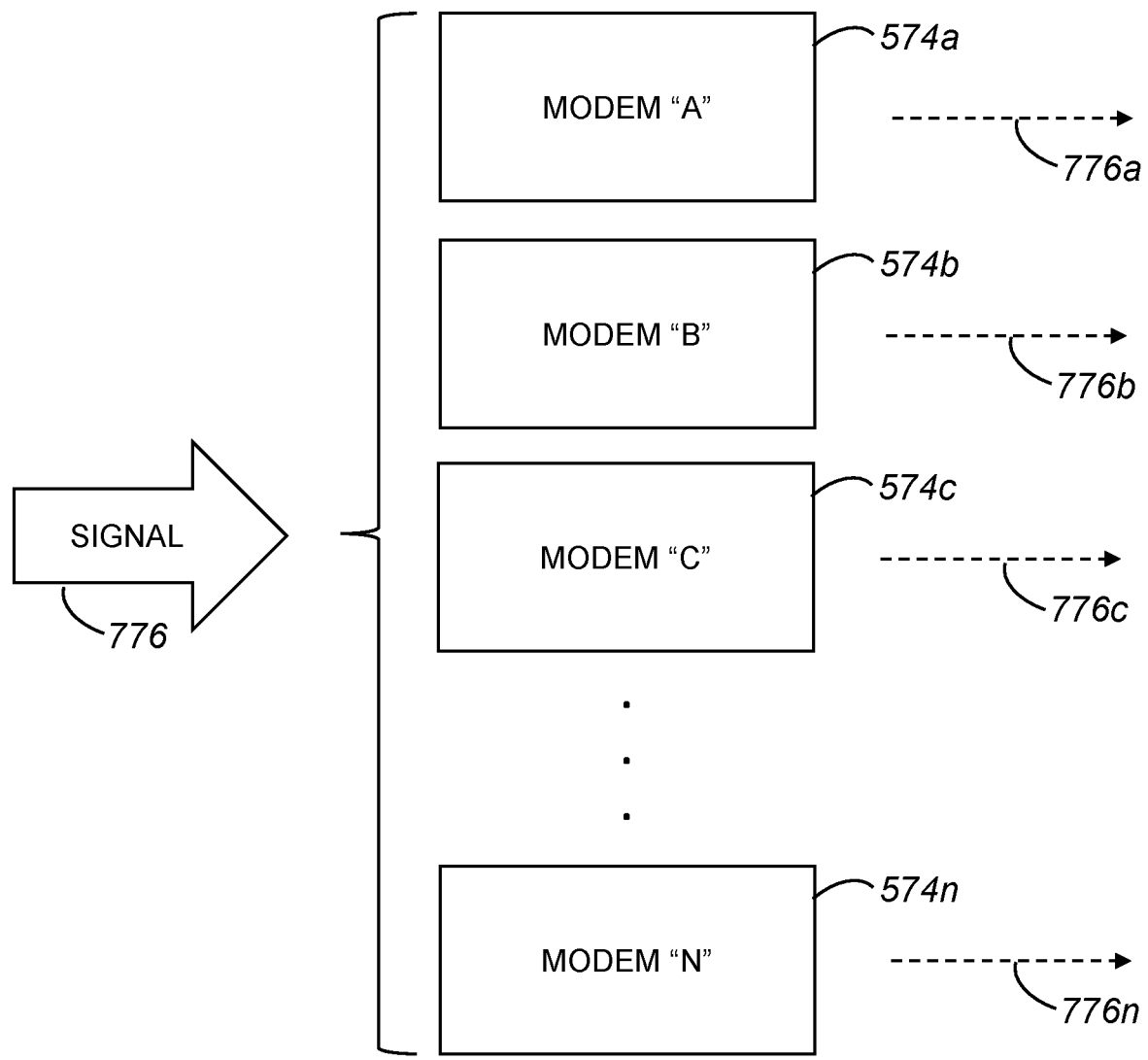
FIG. 7A is a diagrammatic representation of a signal that is substantially divided and allocated to multiple modems, e.g., modems 574a-n of FIG. 5, in accordance with an embodiment.
Figure 7B:
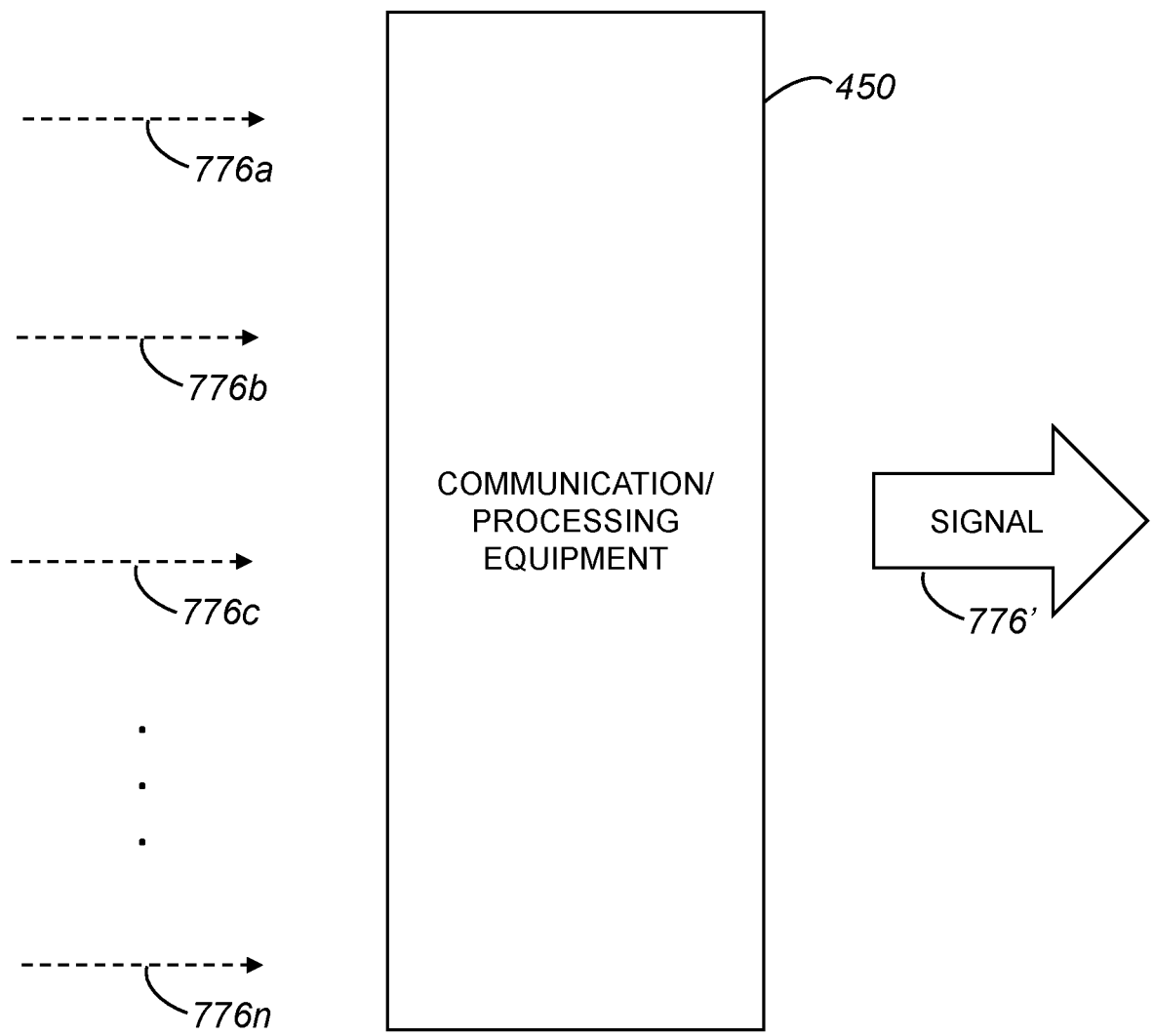
FIG. 7B is a diagrammatic representation of a divided signal, e.g., divided signal 776 of FIG. 7A, that is processed by communication/processing equipment, e.g., communication/processing equipment 450 of FIG. 4, in accordance with an embodiment.

With reference to FIGS. 7A and 7B, the deconstruction of a signal into components to be sent on modems, and the subsequent reconstruction of the signal upon receipt of the components will be described in accordance with an embodiment. FIG. 7A is a diagrammatic representation of a signal that is substantially divided and allocated to multiple modems, e.g., modems 574a-n of FIG. 5, and FIG. 7B is a diagrammatic representation of a divided signal that is processed by communication/processing equipment, e.g., communication/processing equipment 450 of FIG. 4. A signal 776, which may contain video data or autonomy data, is arranged to be provided by modems 574a-n to communication/processing equipment 450. The number of modems 574a-n which are used to transmit or to send data to communication/processing equipment 450 may vary widely. While substantially all modems 574a-n onboard an autonomous vehicle may be used, it should be understood that modems 574a-n which are effectively not functional, or are not functioning as expected, may be prevented from being used to transmit or to send data.

Each modem 574a-n may be allocated a particular bandwidth, e.g., a particular amount of data to transmit. In other words, signal 776 may be divided or otherwise apportioned such that each modem 574a-n is allocated a fraction or portion of signal 776 to transmit. As shown, each modem 574a-n is arranged to provide a respective portion 776a-n of signal 776 via channels to communication/processing equipment 450. The portion 776a-n allocated to each modem 574a-n, respectively, may vary, and may allocated be based on factors including, but not limited to including, available bandwidth and latency associated with each modem 574a-n. Portions 776a-n of may be substantially equal such that each portion 776a-n includes approximately the same number of bits. That is, each modem 574a-n may be allocated approximately the same bandwidth. Alternatively, portions 776a-n may essentially be unequal and modems 574a-n may instead be allocated different amounts of bandwidth.

In one embodiment, portions 776a-n may be sent substantially in parallel by modems 574a-n to communication/processing equipment 450. That is, portions 776a-n may be sent substantially simultaneously. Upon receiving or obtaining portions 776a-n, communication/processing equipment 450 effectively reconstructs or assembles portions 776a-n into a composite signal 776' that represents signal 776.

Figure 8:
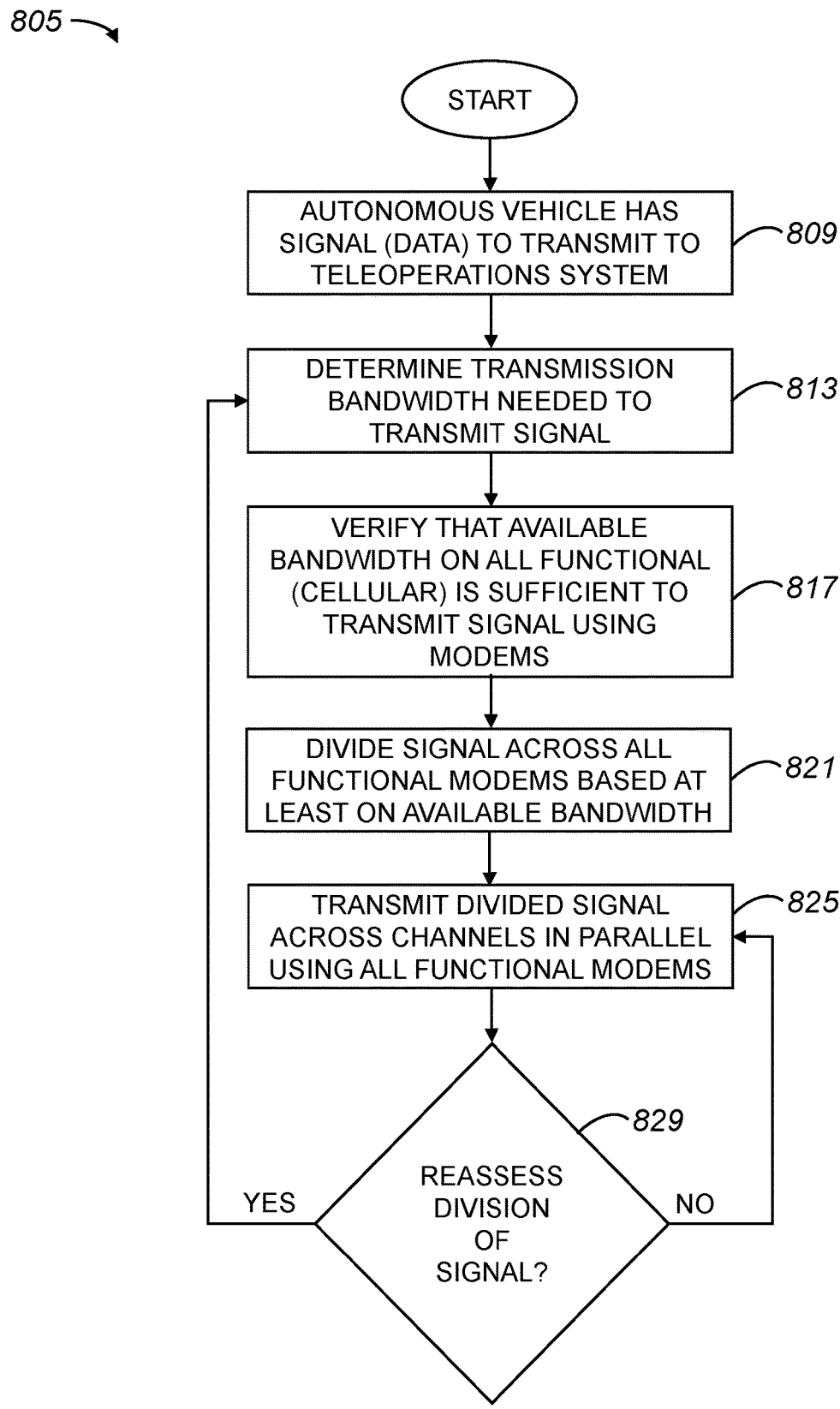
FIG. 8 is a process flow diagram which illustrates a method of allocating bandwidth to channels used to transmit data between an autonomous vehicle and a teleoperations system in accordance with an embodiment.

FIG. 8 is a process flow diagram which illustrates a method of allocating bandwidth to channels used to transmit data between an autonomous vehicle and a teleoperations system in accordance with an embodiment. A method 805 begins at a step 809 in which an autonomous vehicle has a signal, or data, to transmit to a teleoperations system. For example, the autonomous vehicle may have a signal that includes data collected by sensors that is to be transmitted to a teleoperations system to enable the teleoperations system to monitor the autonomous vehicle. The sensor data may include, but is not limited to including, lidar data, radar data, image, or camera data, and/or data which provides an indication of the state of systems of the autonomous vehicle.

A determination is made in a step 813 regarding the transmission bandwidth needed to transmit the signal to the teleoperations system. Once the necessary transmission bandwidth is identified, the amount of available bandwidth on all functional modems onboard the autonomous vehicle is substantially verified as being sufficient to transmit the signal using the modems in a step 817. That is, the amount of bandwidth available on all modems which are available for use is determined and substantially confirmed to be sufficient to transmit the signal.

In a step 821, the signal is effectively divided such that substantially all functional modems are provided with an allocation of the signal, e.g., a percentage of the signal or an amount of the signal that each modem is expected to transmit or to send. It should be appreciated that each available modem may be allocated substantially the same amount of bandwidth, or each available modem may be allocated a different amount of bandwidth. Factors used to determine how to divide the signal may include, but are not limited to including, the amount of bandwidth needed to transmit the signal and/or the amount of bandwidth available on all available modems.

After the signal is divided, the divided signal is transmitted in a step 825 across channels from the functional modems to the teleoperations system. A determination is then made in a step 829 as to whether the division of the signal is to be reassessed. That is, it is determined in step 829 if bandwidth requirements have changed and/or if the current allocation of the signal to each functional modem is efficient or adequate. Such a determination may be made periodically, or may effectively be triggered based on certain conditions, e.g., based on a modem exhibiting a latency issue. One method of determining whether the division of the signal is to be reassessed will be discussed below with respect to FIG. 9.

If the determination in step 829 is that the division of the signal is to be reassessed, then process flow returns to step 813 in which the transmission bandwidth needed to transmit the signal is redetermined. Alternatively, if it is determined in step 829 that the division of the signal is not to be reassessed, then the divided signal continues to be transmitted across channels in step 825.

Figure 9:
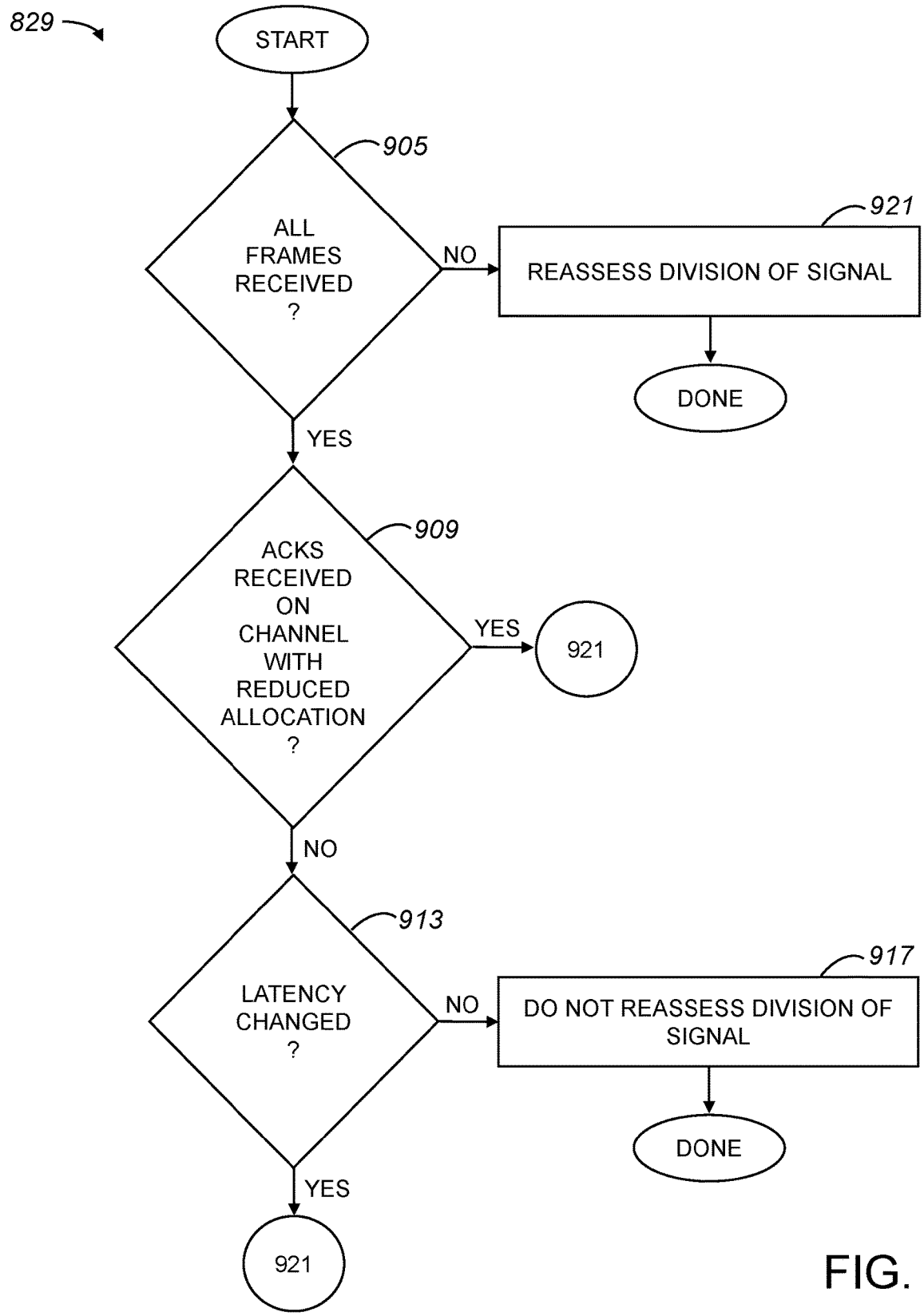
FIG. 9 is a process flow diagram which illustrates a method of reassessing a division of a signal, or reallocating bandwidth on multiple channels, e.g., step 829 of FIG. 8, in accordance with an embodiment.
Figure 10A:
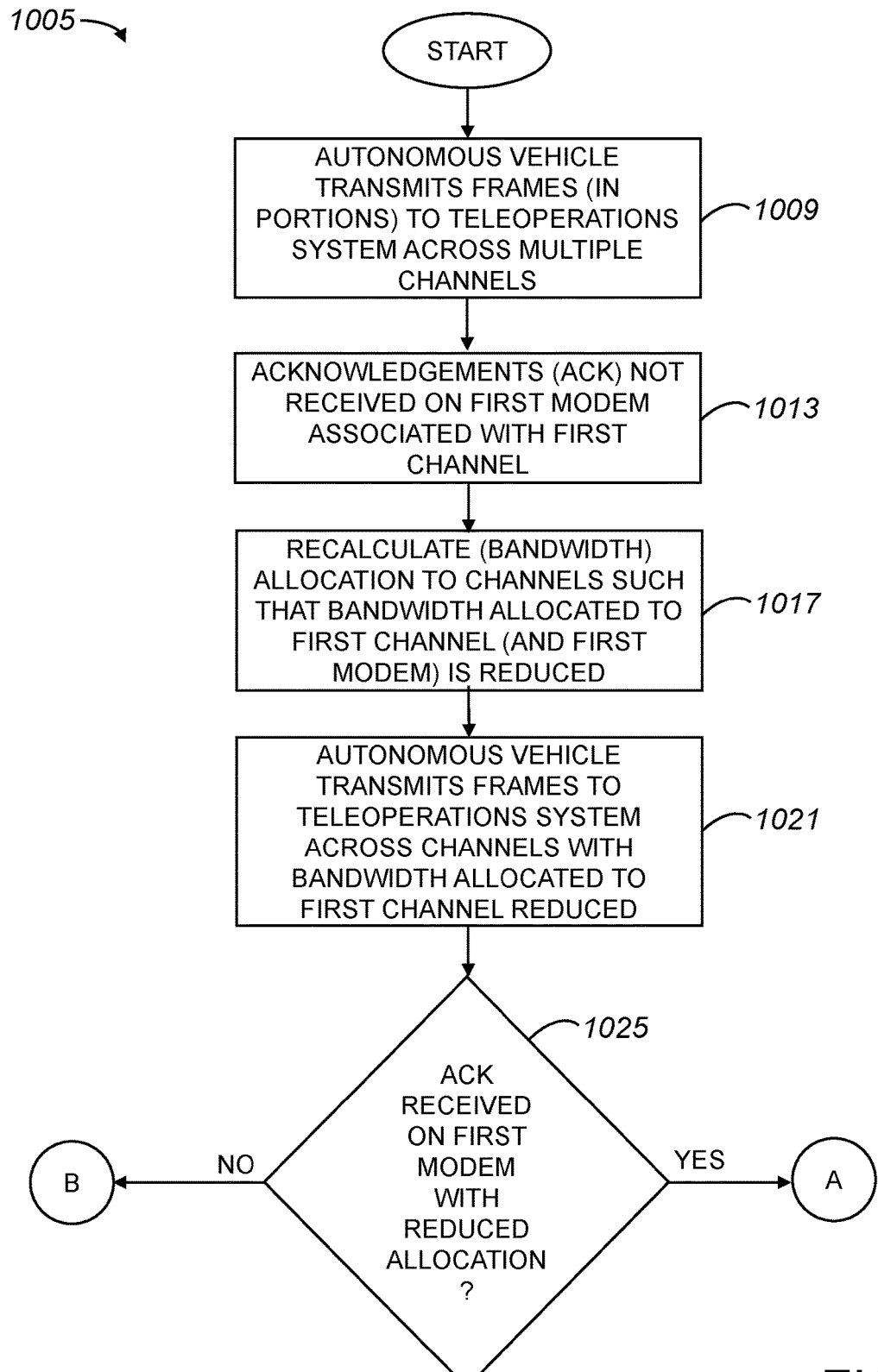
FIGS. 10A-D are a process flow diagram which illustrates a method of transmitting data across multiple channels in accordance with an embodiment.
Figure 10B:
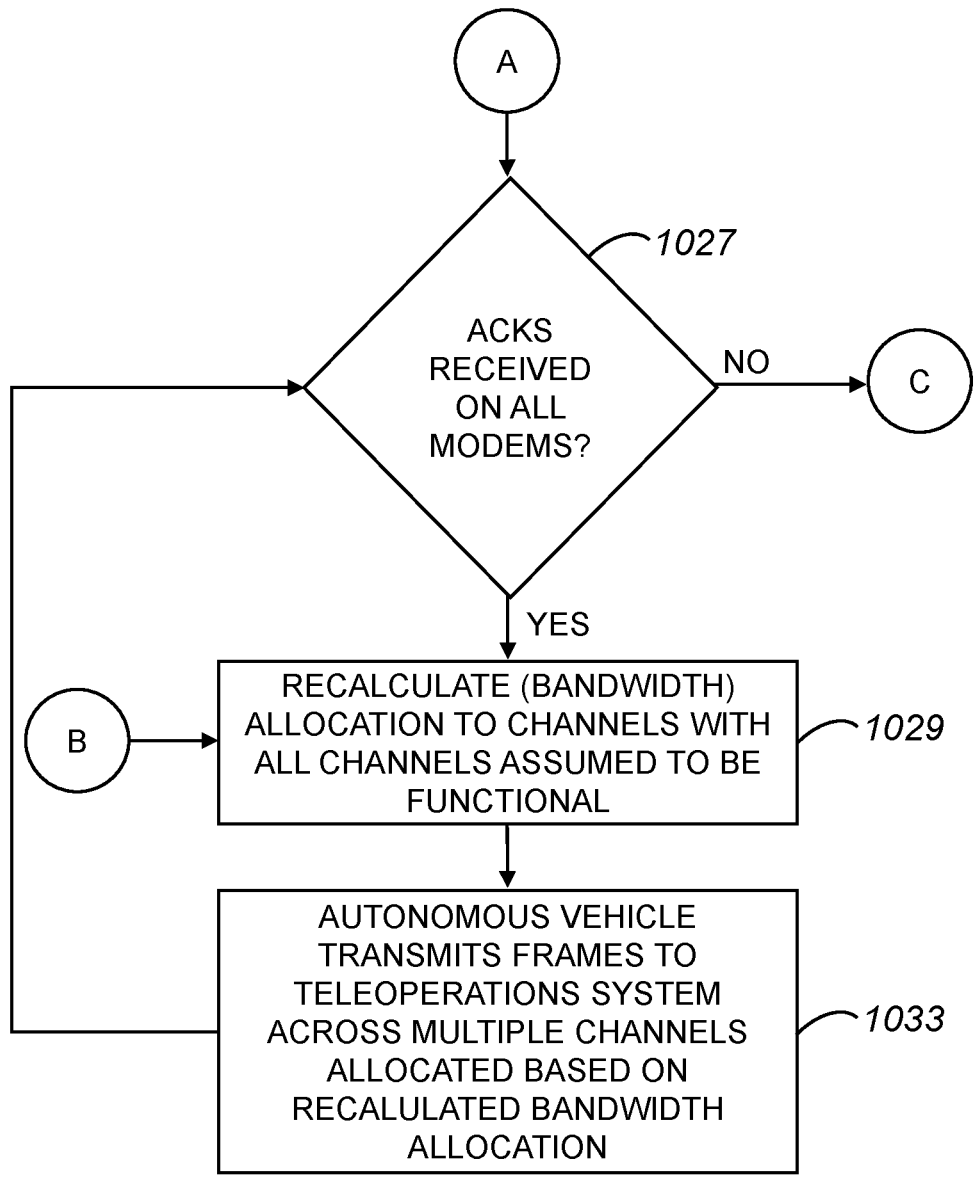
Figure 10C:
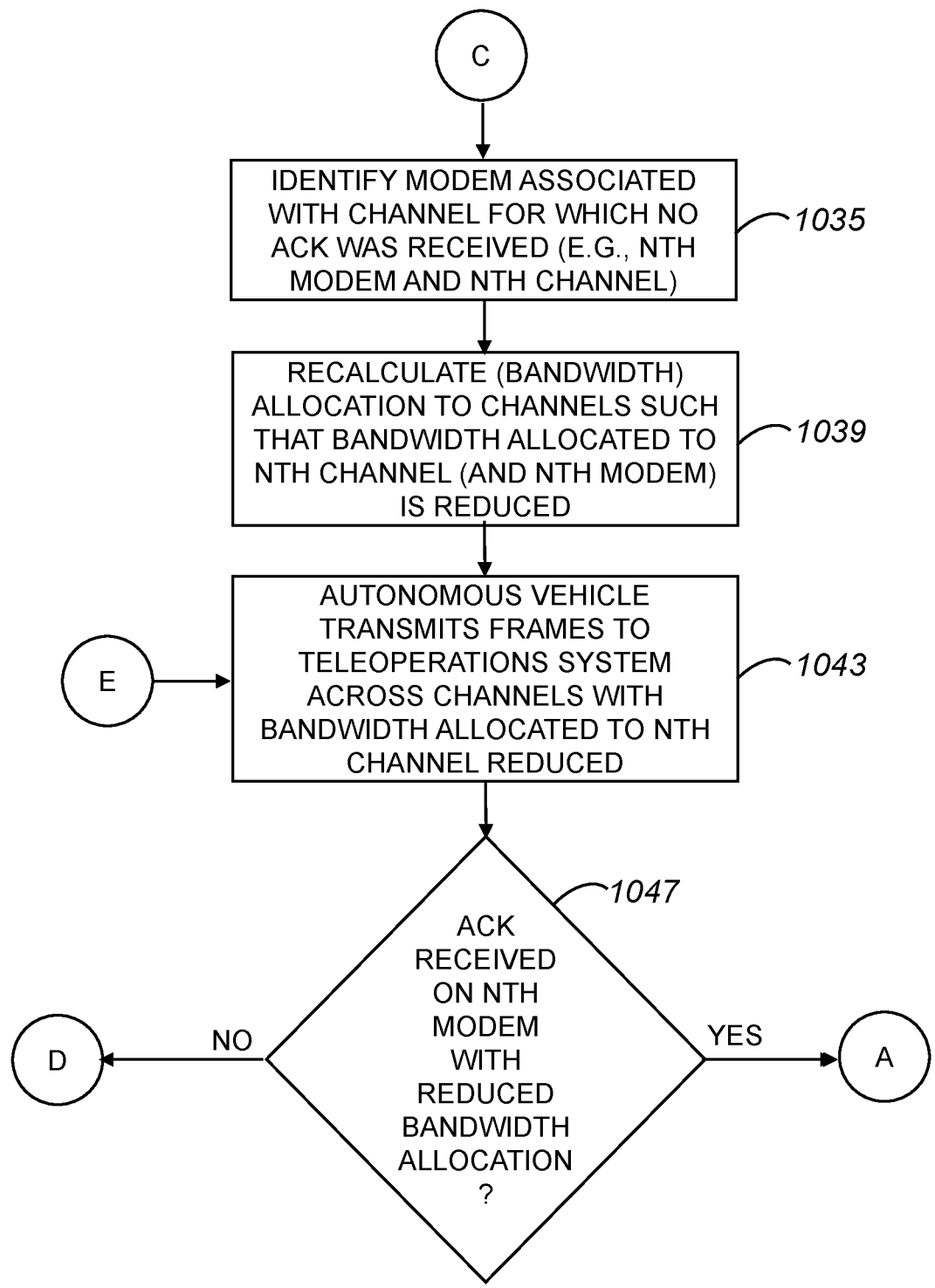
Figure 10D:
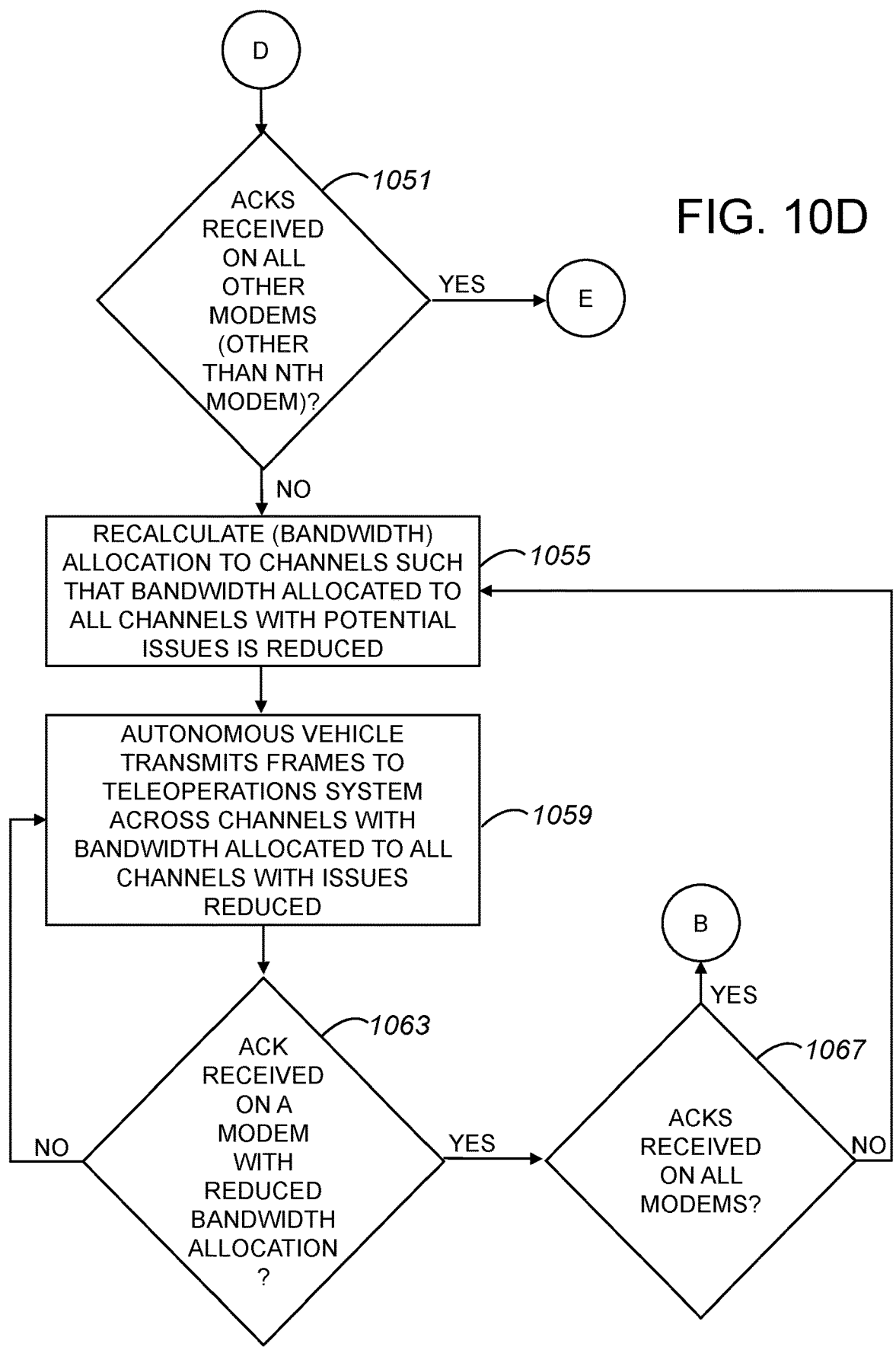

FIG. 9 is a process flow diagram which illustrates a method of reassessing a division of a signal, or reallocating bandwidth on multiple channels, e.g., step 829 of FIG. 8, in accordance with an embodiment. Method 829 of reassessing the division of a signal begins at a step 905 in which it is determine whether substantially all signals, e.g., frames, effectively sent by functional modems of an autonomous vehicle have been received by a teleoperations system. Such a determination may include, but is not limited to including, determining whether ACKs have been received by each functional modem on each channel from the teleoperations system. As will be appreciated by those skilled in the art, a window or predetermined amount of time may be specified such that the determination of whether all frames or portions of all frames have been received is effectively a determination of whether all frames sent in a window or during a predetermined time period have been received or have otherwise reached their intended destinations.

If the determination in step 905 is that not all frames or portions of frames have been received, the implication is that at least one modem may no longer be functioning as expected. For example, the indication may be that at least one modem is exhibiting latency issues or may be inoperable. Accordingly, in a step 921, the division of the signal is reassessed and the method of reassessing the division of a signal is completed. Reassessing the signal may include, but is not limited to including, determining an amount of bandwidth needed to transmit the signal and/or how the signal is to be divided for transmission.

Alternatively, if the determination in step 905 is that substantially all frames or all portions of frames have been received, then in a step 909, it is determined whether ACKs have been received on a channel which previously had its bandwidth allocation reduced. In one embodiment, determining whether ACKs have been received on a channel which previously had its bandwidth allocation reduced includes considering how long it took for the ACK to arrive, i.e., a round-trip latency is considered. It should be appreciated that in some instances, when it is determined that a particular modem is dropping frames, the bandwidth allocation of that modem may be reduced or diminished. Reducing the bandwidth allocation of a modem that is dropping frames enables the modem to continue to send frames, and facilitates the assessment of whether the modem eventually stops dropping frames, as for example be ascertaining when ACKs may once again begin to be received by the modem. The determination of whether ACKs are received on a channel associated with a modem with a reduced or diminished bandwidth allocation is effectively a determination of whether that modem is once again functioning as expected.

If the determination in step 909 is that ACKs have been received on a channel with a reduced bandwidth allocation, then in step 921, the division of the signal is reassessed. Alternatively, if it is determined that ACKs have not been received on a channel with a reduced bandwidth allocation, then it is determined in a step 913 whether latency has changed. That is, a determination is made in step 913 whether the latency associated with the various modems and channels which send data has changed. If it is determined that latency has changed, then the division of the signal is reassessed in step 921. On the other hand, if the determination is that latency has not changed, the indication is that the division of the signal does not need to be reassessed. Thus, in a step 917, it is determined that the division of the signal is not to be reassessed, and the method of reassessing the division of the signal is completed.

With reference to FIGS. 10A-D, a method of transmitting data across multiple channels will be described in accordance with an embodiment. A method 1005 of transmitting data, or otherwise providing data, begins at a step 1109 in which an autonomous vehicle transmits an overall signal, which includes frames, to a teleoperations system. A frame may generally refer to a relatively large piece of data that is to be received in its entirety by the teleoperations system, while a packet may generally refer to a relatively small piece of data that an underlying network protocol may send in substantially one piece. A frame may include, but is not limited to including, approximately one to approximately fifty packets, although the number of packets included in a frame may vary widely. In the described embodiment, the overall signal is effectively divided such that portions of frames are sent across multiple channels that correspond to multiple modems. Each of the multiple modems may be associated with a different service or cellular provider, though it should be appreciated that one or more modems may instead be associated with the same service or cellular provider.

As portions of frames, or frames are transmitted across the multiple channels to the teleoperations system, the teleoperations system may acknowledge receipt of the portions or frames by sending ACKs back to the autonomous vehicle on the multiple channels. When ACKs are not received on a specific channel, the indication may be that the specific channel and, hence, the modem associated with the specific channel, is not fully functional.

In a step 1013, it is effectively determined that ACKs are not received on a first modem associated with a first channel. Such a determination may be made, for example, if no ACKs have been received by the first modem during a particular period of time, or if fewer ACKs than expected have been received by the first modem during the particular period of time.

When it is determined that ACKs are not received on the first modem, the implication is that the first modem may not be fully functional, or not functioning as expected. For example, the indication may be that the first modem and the first channel have latency issues. Accordingly, the bandwidth allocation of signals or frames to modems and their corresponding channels may be dynamically recalculated, reassessed, or reconfigured in a step 1017 such that the first modem reduced allocation of portions of frames to transmit, i.e., a lower allocation than was previously allocated to the first modem, and such that other modems may have an increased allocation of portions of frames to transmit to effectively compensate for the lower allocation assigned to the first modem. In the described embodiment, the first modem is still allocated some portions of frames, or a portion of an overall signal, although it should be appreciated that in some embodiments, the first modem may instead be allocated no packets.

By reducing the allocation of signal or frames to the first modem, if the first modem continues not to function as expected, the effective loss of signals or portions of frames due to a failure of transmission by the first modem may not have a significant effect on the overall signal received by the teleoperations system. Further, because the first modem continues to attempt to transmit, in the event that the first modem begins to function as expected, it may readily be determined that the first modem is once again functional by identifying when ACKs are once again received by the first modem.

Once the allocation of bandwidth is recalculated or otherwise determined in step 1017, the autonomous vehicle transmits portions of frames to teleoperations system across the multiple channels, with the new allocation, i.e., with the reduced allocation the first channel. As portions of frames are transmitted, because the first modem continues to have an allocation to transmit, ACKs may be received by the first modem if the first modem successfully transmits portions of frames. In a step 1025, it is determined whether an ACK has been received on the first modem.

If the determination in step 1025 is that an ACK has been received on the first modem, process flow proceeds to a step 1027 in which it is determined if ACKs have been received on all modems, e.g., all modems associated with multiple channels across which frames were transmitted in step 1009. If it is determined that ACKs have been received on all modems, the bandwidth allocation for each channel is recalculated in a step 1029 with substantially all channels and associated modems assumed to be functional. Once the bandwidth allocation is recalculated, frames are transmitted from the autonomous vehicle to the teleoperations system in a step 1033. The frames may be transmitted in portions across the multiple channels based on the recalculated bandwidth allocation. After frames are transmitted in step 1033, process flow returns to step 1027 in which it is determined whether ACKs are received on all modems.

If it is determined in step 1027 that ACKs have not been received on all modems, the indication is that at least one modem or channel may not be functioning as expected. Accordingly, in a step 1035, the modem associated with the channel for which no ACK was received is identified. The modem may generally be an Nth modem and the channel may generally an Nth channel.

In a step 1039, an overall bandwidth allocation is recalculated such that the bandwidth allocated to the Nth channel, or the channel associated with the modem identified as not receiving an ACK, is reduced. It should be appreciated that the Nth channel may still have some bandwidth allocation to facilitate a determination of when ACKs are once again transmitted across the Nth channel. After the overall bandwidth allocation is recalculated, then the autonomous vehicle transmits frames, e.g., in portions, to the teleoperations in a step 1043 across channels with the bandwidth allocated to the Nth channel reduced.

Once the autonomous vehicle transmits frames to the teleoperations system, a determination is made in a step 1047 as to whether an ACK is received on the Nth modem, or the modem with the reduced allocation. If it is determined that an ACK is received on the Nth modem, then process flow returns to step 1027 in which it is determined if ACKs have been received on all modems, and across all channels.

Alternatively, if it is determined in step 1047 that an ACK has not been received on the Nth modem, it is determined in a step 1051 whether ACKs are received on all other modems other than the Nth modem. If the determination is that all other modems other than the Nth model are receiving ACKs, then process flow returns to step 1043 in which the autonomous vehicle transmits frames to the teleoperations system across channels with the bandwidth allocated to the Nth channel reduced.

On the other hand, if it is determined in step 1051 that ACKs are not received on all other modems other than the Nth modem, the indication is that at least one modem in addition to the Nth modem which may have an issue, as for example a latency issue. As such, in a step 1055, the bandwidth allocation to channels is recalculated such that the bandwidth allocated to substantially all channels with potential issues is reduced. Then, in a step 1059, the autonomous vehicle transmits frames to the teleoperations system across channels with a bandwidth reduction for substantially all channels with issues.

From step 1059, process flow moves to a step 1063 in which a determination is made as to whether an ACK is received on a modem with a reduced bandwidth allocation. If it is determined that an ACK has not been received on any modem with a reduced bandwidth allocation, then process flow returns to step 1059 in which the autonomous vehicle continues to transmit frames to a teleoperations system across channels with a reduced bandwidth allocation to substantially all channels with issues.

Alternatively, if it is determined that an ACK has been received on a modem with a reduced bandwidth allocation, then a determination is made in a step 1067 as to whether ACKS have been received on all modems. If it is determined that ACKs have not been received on all modems, the indication is that at least one modem and associated channel continues to have an issue. As such, process flow returns to step 1055 in which a bandwidth allocation is recalculated such that the bandwidth allocated to substantially all channels that have a potential issue is reduced. On the other hand, if the determination in step 1607 is that ACKS have been received on all modems, then the bandwidth allocation to channels is recalculated in step 1029 with all channels assumed to be functional.

Returning to step 1025, if the determination is that no ACK has been received on the first modem, the indication is that the first modem is still not functioning as expected, e.g., the first modem may continue to have a latency issue. As such, process flow moves to step 1029 in which the bandwidth allocation to channels is recalculated based on an assumption that all channels are functional.

Figure 11A:
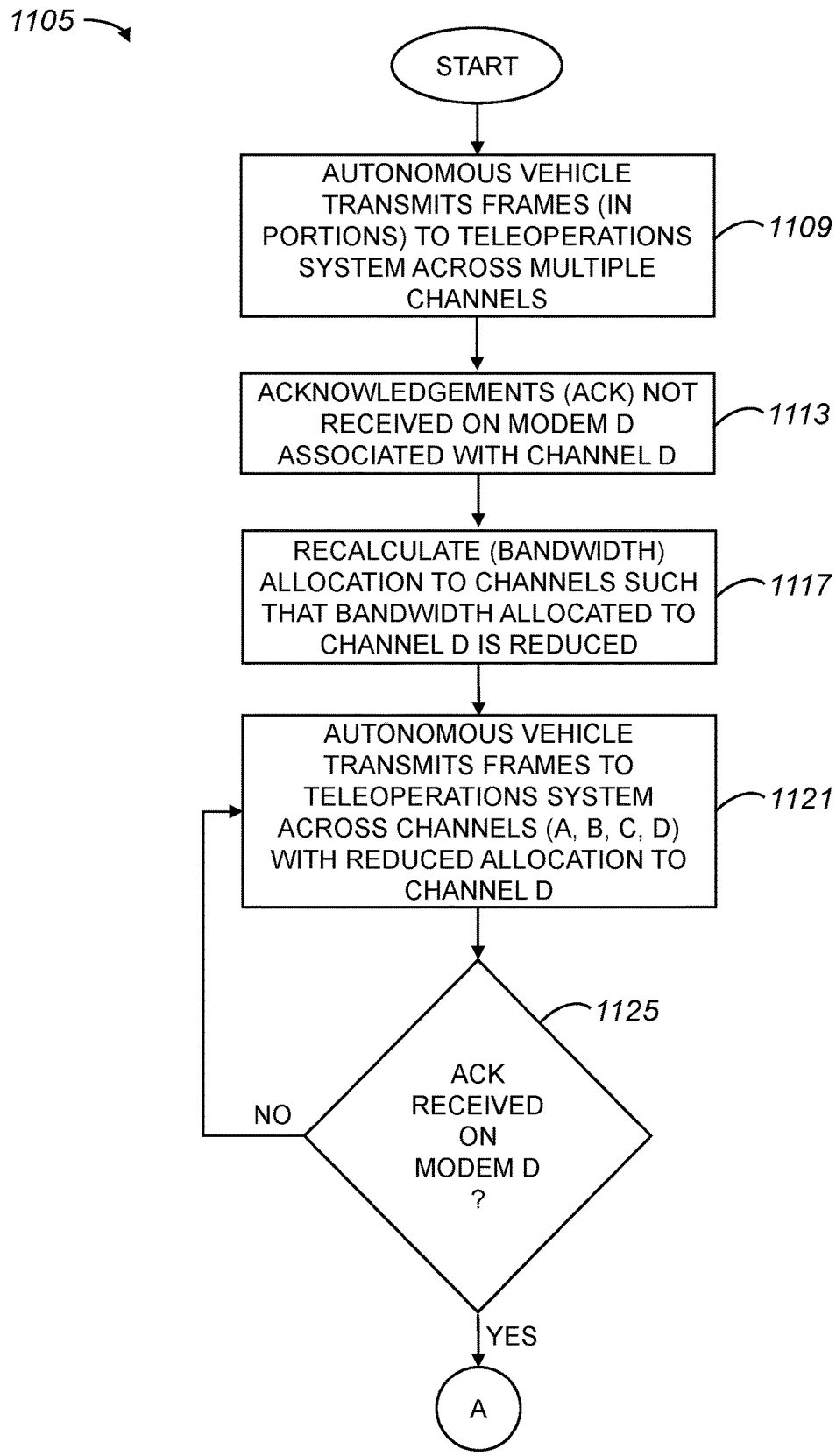
FIGS. 11A and 11B are a process flow diagram which illustrates an example of a method of transmitting data across multiple channels in accordance with an embodiment.
Figure 11B:
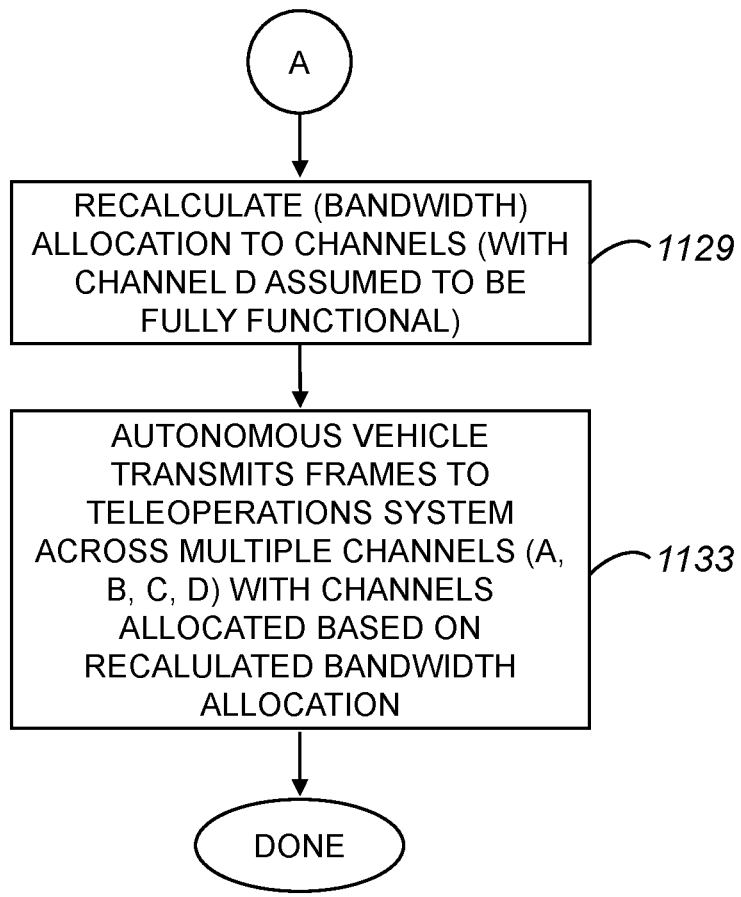

Referring next to FIGS. 11A and 11B, one example of transmitting data to a teleoperations system across multiple channels using multiple modems, e.g., across four channels each of which is associated with a different modem, of an autonomous vehicle will be described in accordance with an embodiment. A method 1105 of transmitting data, or otherwise providing data, begins at a step 1109 in which an autonomous vehicle transmits an overall signal, which includes frames, to a teleoperations system. In the described embodiment, the overall signal is effectively divided such that portions of frames are sent across multiple channels that correspond to multiple modems. The multiple channels include channels A, B, C, and D, which correspond to multiple modems including modems A, B, C, and D, respectively. It should be appreciated that although four channels and four modems are described, the number of channels and modems may vary widely.

In a step 1113, it is effectively determined that ACKs are not received on or by modem D, or the modem associated with channel D. Such a determination may be made, for example, if no ACKs have been received on modem D during a particular period of time, or if fewer ACKs than expected have been received during the particular period of time.

When it is determined that ACKs are not received on modem D, the implication is that modem D is not fully functional, or not functioning as expected. Accordingly, the bandwidth allocation of portions of frames to modems and their corresponding channels may be dynamically recalculated, reassessed, or reconfigured in a step 1117 such that modem D has a reduced allocation of portions of frames, i.e., a lower allocation than modem D was previously allocated, and such that at least one of modems A, B, and C may have an increased allocation of portions of frames. In the described embodiment, modem D is still allocated some portions of frames, or a portion of an overall signal, although it should be appreciated that in some embodiments, modem D may instead be allocated no portions of frames.

By reducing the allocation of portions of frames to modem D, if modem D continues not to function as expected, the effective loss of portions of frames due to a failure of transmission by modem D may not have a significant effect on the overall signal received by the teleoperations system. Further, because modem D continues to attempt to transmit a signal, in the event that modem D begins to function as expected, it may readily be determined that modem D is once again functional by identifying when ACKs are received by modem D.

Once the allocation of portions of frames is recalculated in step 1117, the autonomous vehicle transmits portions of frames to the teleoperations system across the multiple channels, with the new allocation, i.e., with the reduced allocation to channel D. As portions of frames are transmitted, because modem D continues to have an allocation of portions of frames to transmit, ACKs may be received by modem D if modem D successfully transmits packets. In a step 1125, it is determined whether an ACK has been received on modem D. If the determination is that no ACK has been received on modem D, the indication is that modem D is still not functioning as expected. As such, the autonomous vehicle continues to transmit portions of frames to the teleoperations system in step 1121.

Alternatively, if it is determined in step 1125 that an ACK has been received on modem D, then the implication is that modem D is likely to be fully functional again. As such, in a step 1129, a bandwidth allocation to the channels and their respective modems is recalculated, with modem D assumed to be fully functional. In other words, the allocation of portions of frames to all functional modems is reassessed based on an assumption that modem D is effectively fully available. After the allocation is recalculated in step 1129, process flow moves to a step 1133 in which the autonomous vehicle transmits portions of frames to the teleoperations system across the multiple channels using the recalculated allocation, and the method of transmitting data is completed.

In general, as mentioned above. when a signal is effectively broken up in order to enable the signal to be transmitted or otherwise provided by an autonomous vehicle to a teleoperations system, the signal may be reassembled or reconstructed upon being obtained by the teleoperations system. The reconstructed signal may then be processed by the teleoperations system, e.g., displayed on a visual interface such as a display screen. In one embodiment, an ACK may be provided by the teleoperations system on a channel via which the teleoperations system obtained a portion of a frame.

Figure 12A:
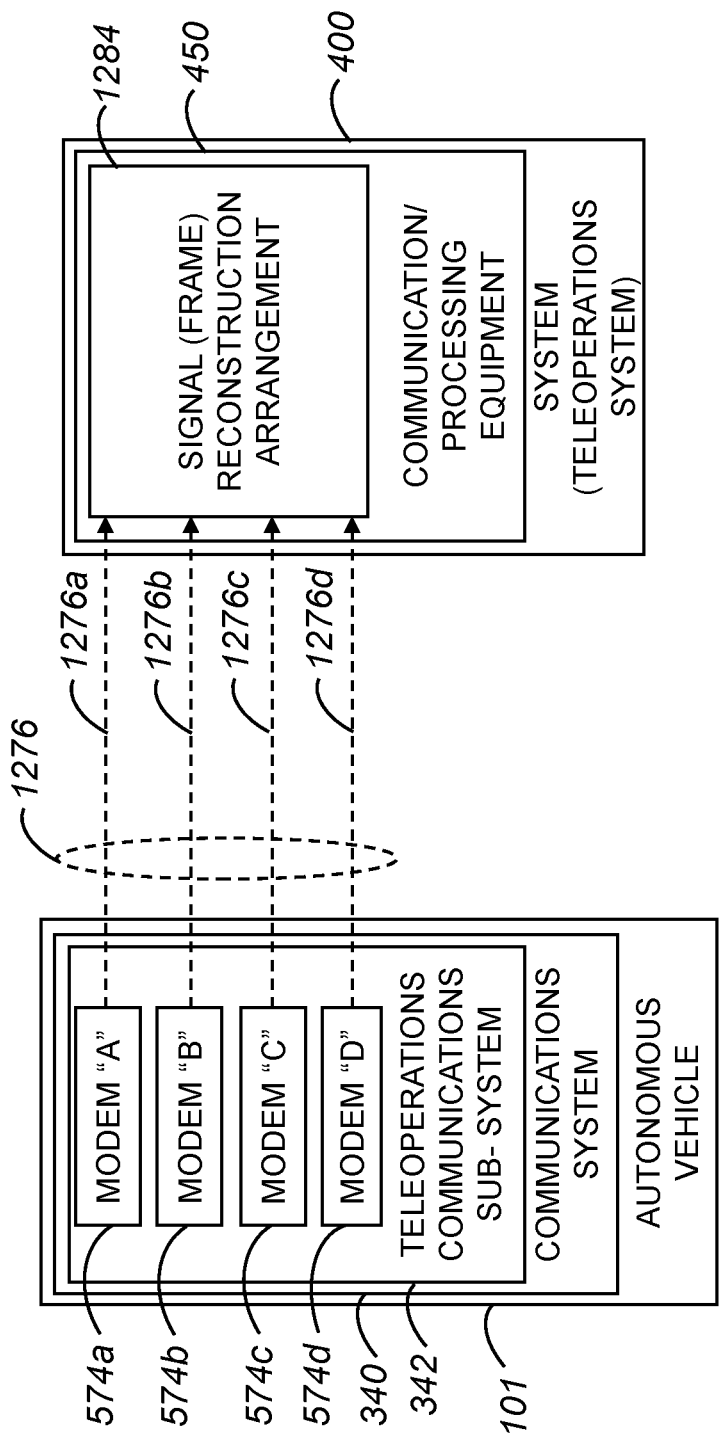
FIG. 12A is a diagrammatic representation of communications from a communications system of an autonomous vehicle, e.g., communications system 340 of FIG. 3, to a system such as a teleoperations system, e.g., system 400 of FIG. 4, in accordance with an embodiment.

When a teleoperations system is to send packets to an autonomous vehicle, e.g., packets which are associated with instructions that allow the autonomous vehicle to be controlled by the teleoperations system, the packets may be replicated and sent across substantially all available channels. In other words, a signal sent from a teleoperations system to an autonomous vehicle may be copied and transmitted across substantially all available channels. FIG. 12A is a diagrammatic representation of communications from a communications system of an autonomous vehicle, e.g., communications system 340 of FIG. 3, to a system such as a teleoperations system, e.g., system 400 of FIG. 4, in accordance with an embodiment. When a signal 1276, which may include a frame, is to be provided from autonomous vehicle 101 to system 400, signal 1276 may be divided or apportioned such that portions 1276*a-d* of signal 1276 may effectively be sent from respective modems 574*a-d*. In one embodiment, portions 1276*a-d* may be approximately equal, e.g., may be associated with substantially the same bandwidth allocation. As will be understood by those skilled in the art, a frame generally includes a frame identifier (ID) which identifies the frame and a payload that contains data or information.

Portions 1276*a-d* typically include a frame ID which identifies a frame of which portions 1276*a-d* are a part, and data contained in a payload of the frame. Thus, when portions 1276*a-d* are provided by modems 574*a-d*, respectively, to system 400, a signal reconstruction arrangement 1294 of communication/processing equipment 450 may effectively reconstruct signal 1276 to recreate a frame from portions 1276*a-d*. Frame reconstruction may involve the use of an external library for an error correction and/or reconstruction process. Such frame reconstruction may be based on, but is not limited to being based on, Vandermonde matrices and/or Reed Solomon codes.

Figure 12B:
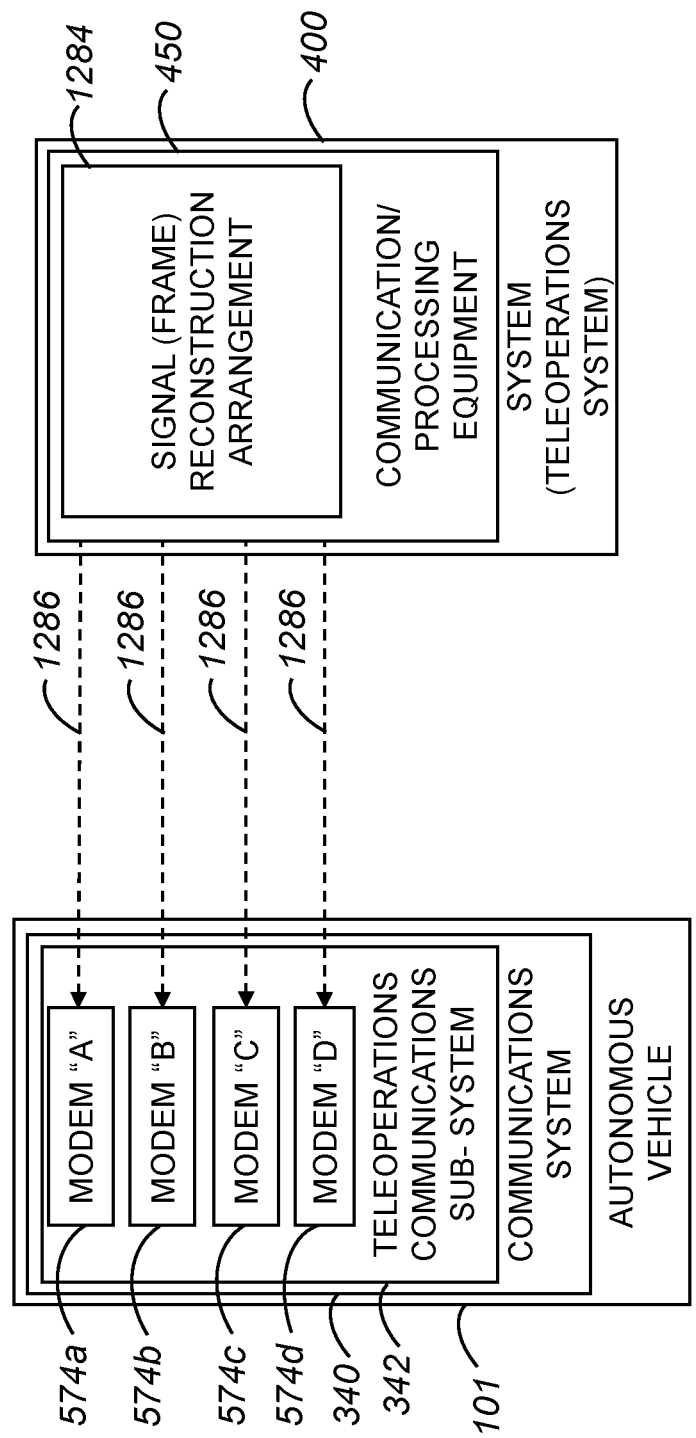
FIG. 12B is a diagrammatic representation of communications from a system such as a teleoperations system, e.g., system 400 of FIG. 4, to a communications system of an autonomous vehicle, e.g., communications system 340 of FIG. 3, in accordance with an embodiment.

FIG. 12B is a diagrammatic representation of communications from system 400 to communications system 340 in accordance with an embodiment. When communication/processing equipment 450 is to be used to provide a signal 1286 from system 450 to teleoperations communications sub-system 342, signal 1286 may be replicated such that signal 1286 is effectively sent across channels associated with each modem 564*a-d*. It should be appreciated that teleoperations communications sub-system 342 may be configured to determine that copies of signal 1286 is obtained by modems 574*a-d*, e.g., may include hardware and/or software arranged to determine that signals 1286 obtained from communication/processing equipment are substantially the same. Teleoperations communications sub-system 342 may identify that signals 1286 are substantially the same, and select one signal 1286 for processing. In one embodiment, the selected signal 1286 may be the strongest signal or have the highest signal strength, and/or may be associated with a relatively low latency. Signal 1286 may include instructions intended to be processed, upon being received by teleoperations communications sub-system, 342, to substantially enable an autonomous vehicle, e.g., autonomous vehicle 101 of FIGS. 2 and 3, to be substantially controlled by system 400.

Figure 13:
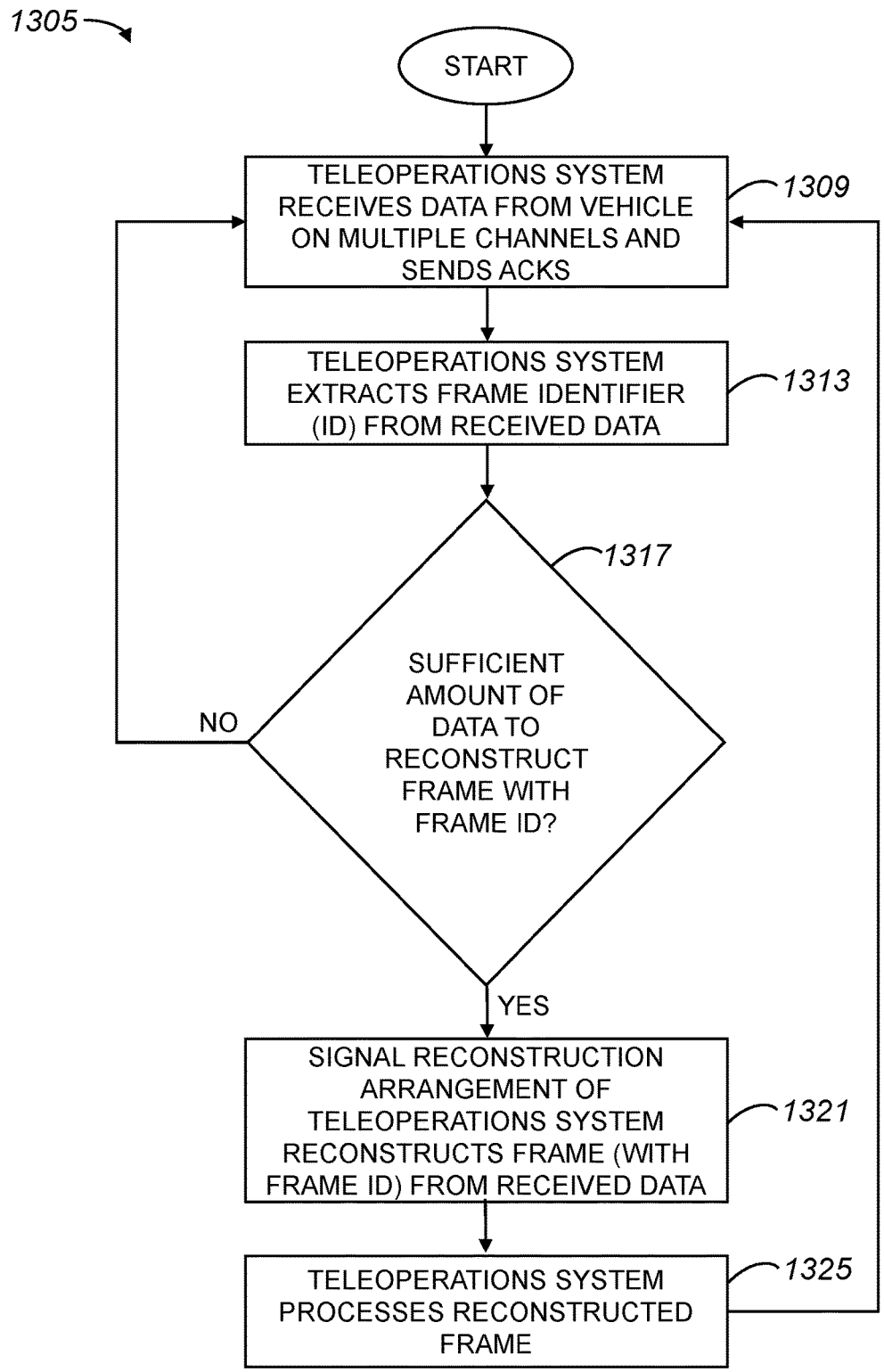
FIG. 13 is a process flow diagram which illustrates a method of processing received or otherwise obtained data on a teleoperations system from a vehicle in accordance with an embodiment.

FIG. 13 is a process flow diagram which illustrates a method of processing received or otherwise obtained data on a teleoperations system from a vehicle in accordance with an embodiment. A method 1305 of processing received or otherwise obtained data on a teleoperations system begins at a step 1309 in which a teleoperations system receives data from a vehicle on multiple channels, and sends ACKs to the vehicle to acknowledge receipt of the data. The data obtained may be, in one embodiment, portions of frames sent to the teleoperations systems on multiple channels.

Once the teleoperations system receives data and sends ACKs, the teleoperations system extracts a frame ID from the data, e.g., from portions of frames included in the data, in a step 1313. Portions of frames obtained by teleoperations system may be parsed to identify frame IDs. Once at least one frame ID is extracted from the data, it is determined in a step 1317 whether a sufficient amount of data has been received to allow the frame with the frame ID to be substantially reconstructed. In other words, a determination is made in step 1317 whether an overall frame has effectively been received in portions or components.

If the determination in step 1317 is that a sufficient amount of data has not been received to enable a frame with a frame ID to be reconstructed, the indication is that additional data may is needed to enable reconstruction. As such, process flow returns to step 1309 in which the teleoperations system continues to receive or to otherwise obtain data from the vehicle on multiple channels.

Alternatively, if the determination in step 1317 is that a sufficient amount of data has been received to enable a frame with a frame ID to be reconstructed, then in a step 1321, a signal reconstruction arrangement of the teleoperations system reconstructs the frame from the received data, e.g., assembles the received portions or components of the frame to recreate the frame.

Once the frame is reconstructed, the teleoperations system processes the reconstructed frame in a step 1325. Processing the reconstructed frame may include, but is not limited to including, effectively displaying the frame on a visual interface, e.g., display screen, of the teleoperations system to provide a human operator with a view of an environment around the vehicle. After the teleoperations system processes the reconstructed frame, process flow returns to step 1309 in which the teleoperations system continues to receive data from the vehicle.

As will be appreciated by those skilled in the art, in addition to receiving signals from a vehicle, a teleoperations system may also send signals to the vehicle. For example, a teleoperations system may send signals to a vehicle that enable the teleoperations system to control the vehicle. That is, signals sent by the teleoperations system to the vehicle may allow a teleoperator to effectively remotely drive the vehicle.

Typically, signals sent from a teleoperations system to a vehicle will utilize less bandwidth than signals sent from the vehicle to the teleoperations system. For example, frames associated with images such as video images transmitted from a vehicle to a teleoperations system may utilize significant bandwidth, while signals sent from the teleoperations system to the vehicle that enable the teleoperations system to essentially command the vehicle may require less bandwidth.

Figure 14:
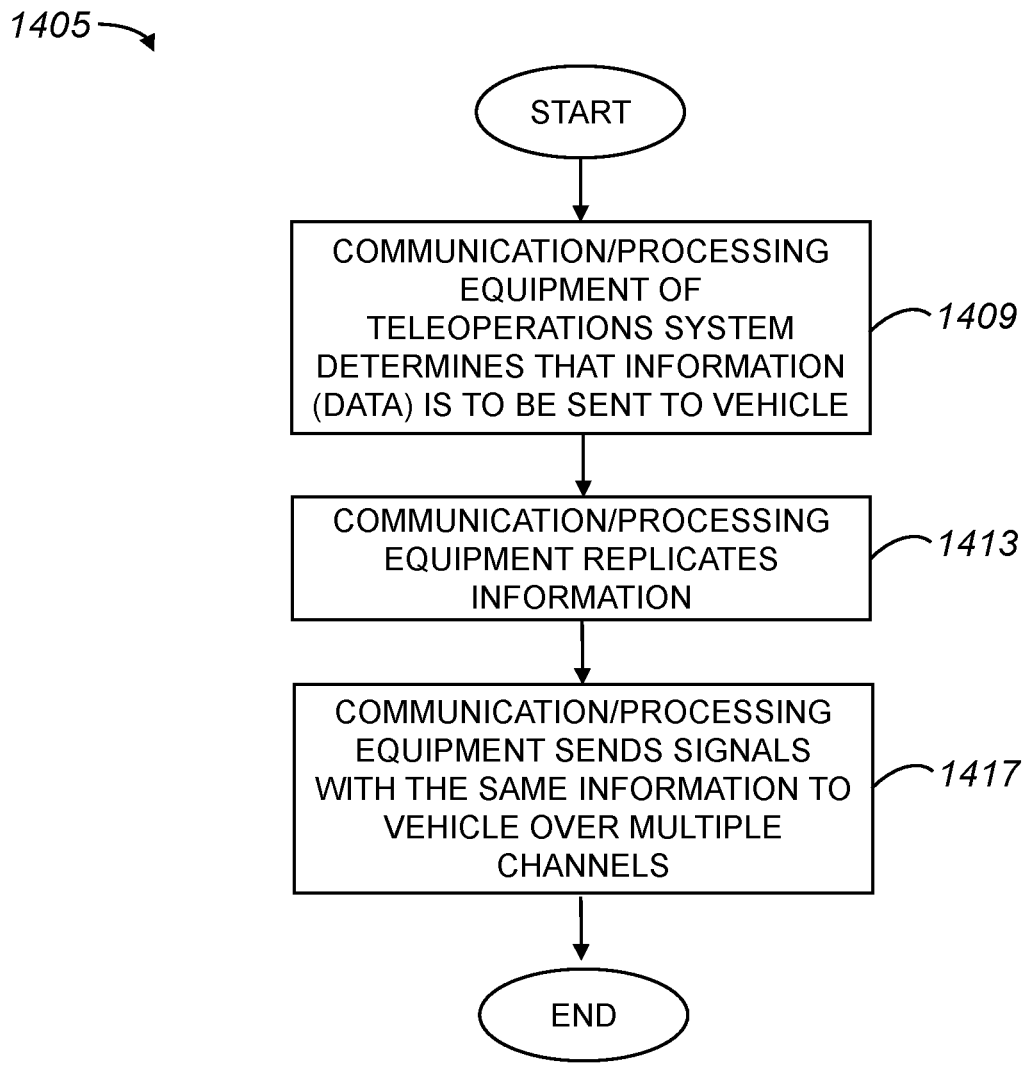
FIG. 14 is a process flow diagram which illustrates a method of sending or otherwise providing information to a vehicle from a teleoperations system in accordance with an embodiment.

FIG. 14 is a process flow diagram which illustrates a method of sending or otherwise providing information from a teleoperations system to a vehicle in accordance with an embodiment. A method 1405 of sending information from a teleoperations system to a vehicle begins at a step 1409 in which communication/processing equipment of a teleoperations system determines that information is to be sent to a vehicle. In one embodiment, when the vehicle is to be substantially controlled by the teleoperations system, it may be determined that data is to be provided by the teleoperations system to the vehicle.

Once it is determined that information is to be sent to a vehicle, in a step 1413, the communication/processing equipment replicates the information. Replicating the information may include, but is not limited to including, creating copies of the information. After the information is replicated, the communication/processing equipment sends signals which contain the replicated information to the vehicle over multiple channels in a step 1417. In other words, the same information may be sent over multiple channels to the vehicle. By sending the same information over multiple channels, in the event that any channel becomes non-functional or otherwise fails, the information may still be received by the vehicle. As signals sent from the teleoperations system to the vehicle generally utilize less bandwidth than signals sent from the vehicle to the teleoperations system, rather than splitting information between multiple channels for transmission to the vehicle, the information may be replicated and transmitted on each of multiple channels. Once the signals are sent across multiple channels, the method of sending information from a teleoperations system to a vehicle is completed.

Although only a few embodiments have been described in this disclosure, it should be understood that the disclosure may be embodied in many other specific forms without departing from the spirit or the scope of the present disclosure. By way of example, each cellular modem that is onboard an autonomous vehicle has generally been described as being associated with a different cellular provider or carrier. In one embodiment, a subset of the modems may be associated with the same cellular or service provider. In another embodiment, multiple modems may all be associated with the same cellular or service provider. In other words, each modem may be associated with any suitable cellular or service provider.

While a modem has been described as a cellular modem, it should be appreciated that a modem may generally be any device which provides cellular or mobile connectivity, or otherwise supports wireless communications, e.g., wireless communications between a vehicle and a fleet management system or a teleoperations system. A cellular modem may be, but is not limited to being, any suitable wireless modem such as a universal serial bus (USB) modem, a broadband modem, and/or a 3G/4G/5G modem.

The use of multiple modems and, hence, multiple channels to allow for communications between an autonomous vehicle and a system such as a teleoperations system, allows for redundancy that enables the autonomous vehicle to substantially always communicate with the system. It should be appreciated that thresholds may be set to determine when an autonomous vehicle may be taken offline rather than operate essentially without redundancy. For instance, in the event of a catastrophic failure in which none of the modems on an autonomous vehicle may transmit or receive data, the autonomous vehicle may be taken out of operation. Thresholds may be set based on, but not limited to be based on, the number of modems and channels that are functional, and the amount of bandwidth that may be supported by the functional modems and channels.

The window size used to determine whether the bandwidth allocated to each channel of multiple channels is adequate may vary widely. For example, when there has been no ack received on a channel for a predetermined amount of time, the window size used to determine how to reallocate bandwidth may be smaller than the window size used when acks are received as expected.

The number of modems and, hence, channels associated with an autonomous vehicle may generally vary widely. Similarly, the number of cellular carriers or providers that support the modems may also vary widely without departing from the spirit or the scope of the disclosure.

While the modems of the present disclosure have been described as being substantially the same, e.g., the modems may each support 4G or LTE communications, it should be understood that modems included in the same autonomous vehicles may instead support different communications. By way of example, an autonomous vehicle may include at least one modem which supports 4G or LTE communications, and at least one modem which supports 5G communications.

In one embodiment, in lieu of or in addition to using cellular modems, cell phones or smartphones may be used to support cellular communications on an autonomous vehicle. For example, a cell phone or a smartphone may effectively function as a cellular modem and allow an autonomous vehicle to communicate with a teleoperations system. In addition, cellular cards and cellular routers may also be used in lieu of or in addition to cellular modems without departing from the spirit or the scope of the disclosure.

In general, a signal may be divided such that bandwidth associated with the signal may be allocated across multiple modems and channels. The signal may be divided in any suitable manner. For instance, a signal may be divided into sections of a particular length for transmission using multiple modems and channels. Alternatively, a signal may be divided into sections which are anticipated to take a particular amount of time to transmit.

A signal, e.g., a signal that includes frames or packets, sent from a teleoperations system to modems of an autonomous vehicle has generally be described as being copied or replicated such that substantially the same signal is received on each of the modems. It should be understood, however, that in some embodiments, a signal may either not be replicated or a signal may be replicated and sent to a subset of modems. In other embodiments, the signal may be substantially divided into portions or components such that different portions of the same signal may be sent to a vehicle on different channels and modems.

An autonomous vehicle has generally been described as a land vehicle, or a vehicle that is arranged to be propelled or conveyed on land. It should be appreciated that in some embodiments, an autonomous vehicle may be configured for water travel, hover travel, and or/air travel without departing from the spirit or the scope of the present disclosure.

The embodiments may be implemented as hardware, firmware, and/or software logic embodied in a tangible, i.e., non-transitory, medium that, when executed, is operable to perform the various methods and processes described above. That is, the logic may be embodied as physical arrangements, modules, or components. For example, the systems of an autonomous vehicle, as described above with respect to FIG. 3, may include hardware, firmware, and/or software embodied on a tangible medium. A tangible medium may be substantially any computer-readable medium that is capable of storing logic or computer program code which may be executed, e.g., by a processor or an overall computing system, to perform methods and functions associated with the embodiments. Such computer-readable mediums may include, but are not limited to including, physical storage and/or memory devices. Executable logic may include, but is not limited to including, code devices, computer program code, and/or executable computer commands or instructions.

It should be appreciated that a computer-readable medium, or a machine-readable medium, may include transitory embodiments and/or non-transitory embodiments, e.g., signals or signals embodied in carrier waves. That is, a computer-readable medium may be associated with non-transitory tangible media and transitory propagating signals.

The steps associated with the methods of the present disclosure may vary widely. Steps may be added, removed, altered, combined, and reordered without departing from the spirit of the scope of the present disclosure. For example, as discussed above with respect to FIG. 8, an amount of available bandwidth on all functional modems onboard the autonomous vehicle may effectively be verified as being sufficient to transmit a signal. It should be understood, however, that in the event that there is insufficient bandwidth to transmit a signal, mitigating steps including, but not limited to including, causing a vehicle to stop and/or providing an indication to a teleoperations system that an amount of bandwidth available for signal transmission is insufficient. Therefore, the present examples are to be considered as illustrative and not restrictive, and the examples are not to be limited to the details given herein, but may be modified within the scope of the appended claims.

What is claimed is:

1. A method comprising:
identifying a first signal to be provided to a teleoperations system by a vehicle, wherein the first signal includes data, the vehicle configured to operate autonomously or semi-autonomously, the teleoperations system being configured to remotely operate the vehicle;
determining a first amount of bandwidth, the first amount of bandwidth being associated with the first signal;
determining a second amount of bandwidth, the second amount of bandwidth associated with a plurality of modems, the plurality of modems being included on the vehicle to enable the vehicle to communicate with the system, the plurality of modems being associated with a plurality of service providers, wherein the second amount of bandwidth is an approximately total amount of available bandwidth associated with the plurality of modems;
verifying whether the second amount of bandwidth is sufficient to transmit the first signal;
upon verifying that the second amount of bandwidth is sufficient to transmit the first signal, dividing the first signal into a first plurality of portions based at least on the first amount of bandwidth and the second amount bandwidth;
providing the first plurality of portions to the plurality of modems for transmission from the vehicle to the system; and
transmitting the first plurality of portions to the system using the plurality of modems and a plurality of channels, the plurality of channels being associated with the plurality of modems.

2. The method of claim 1 further including:
determining whether an issue associated with a first channel of the plurality of channels and a first modem of the plurality of modems is identified;
when it is determined that there is the issue associated with the first modem, reallocating the first signal, wherein reallocating the first signal includes dividing the first signal into a second plurality of portions, the second plurality of portions including a first portion allocated to the first modem, the first portion being smaller than other portions in the second plurality of portions;
providing the second plurality of portions to the plurality of modems for transmission from the vehicle to the system; and
transmitting the second plurality of portions to the system using the plurality of modems and the plurality of channels.

3. The method of claim 2 further including:
determining whether the issue associated with the first channel and the first modem is resolved;
when it is determined that the issue is resolved, reallocating the first signal, wherein reallocating the first signal includes dividing the first signal into a third plurality of portions;
providing the third plurality of portions to the plurality of modems for transmission from the vehicle to the system; and
transmitting the third plurality of portions to the system using the plurality of modems and the plurality of channels.

4. The method of claim 3 wherein determining whether the issue associated with the first channel and the first modem is resolved includes determining whether an acknowledgement (ACK) is obtained on the first channel from the system, wherein when the ACK is obtained it is determined that the issue is resolved.

5. The method of claim 2 wherein determining whether the issue associated with the first channel of the plurality of channels and the first modem of the plurality of modems is identified includes determining whether an acknowledgement (ACK) is obtained on the first channel from the system in response to the transmitted first plurality of portions, wherein when the ACK is not obtained, it is determined that there is the issue.

6. The method of claim 1 wherein the issue is a latency issue.

7. The method of claim 1 wherein the data includes a frame, the frame including a frame identifier (ID) and a payload, and wherein dividing the first signal into a first plurality of portions includes dividing the payload, wherein each portion of the first plurality of portions includes the frame ID.

8. The method of claim 1 wherein each portion of the first plurality of portions is approximately equal in size, and wherein each modem of the plurality of modems has approximately an equal amount of allocated bandwidth.

9. The method of claim 1 wherein the plurality of modems includes at least a first modem, a second modem, a third modem, and a fourth modem, wherein the first modem is associated with a first service provider of the plurality of service providers, the second modem is associated with a second service provider of the plurality of service providers, the third modem is associated with a third service provider of the plurality of service providers, and the fourth modem is associated with a fourth service provider of the plurality of service providers.

10. The method of claim 1 wherein the vehicle includes at least one sensor, and wherein identifying the first signal includes obtaining the data from the at least one sensor.

11. A vehicle comprising:
at least one sensor, the at least one sensor configured to capture data associated with the vehicle;
a plurality of modems, the plurality of modems being associated with a plurality of channels, wherein each modem of the plurality of modems is configured to allow the vehicle to communicate wirelessly with a teleoperations system over an associated channel of the plurality of channels;
an allocation arrangement, the allocation arrangement configured to allocate a signal that includes the data for transmission to the teleoperations system, wherein the allocation arrangement is configured to allocate the signal by dividing the signal into a first plurality of portions and wherein the plurality of modems is arranged to provide the first plurality of portions to the plurality of channels for transmission to the teleoperations system; and
an assessment arrangement, the assessment arrangement configured to determine when a first modem of the plurality of modems has a performance issue, wherein the allocation arrangement is configured to reallocate the signal when it is determined that the first modem has the performance issue.

12. The vehicle of claim 11 wherein the allocation arrangement is configured to reallocate the signal by dividing the signal into a second plurality of portions that includes a first portion allocated to the first modem, the first portion being smaller than at least a second portion of the second plurality of portions.

13. The vehicle of claim 11 wherein the allocation arrangement is configured to allocate the signal based on an overall available bandwidth associated with the plurality of modems.

14. The vehicle of claim 13 wherein the allocation arrangement is still further configured to allocate the signal based on a bandwidth associated with the signal.

15. The vehicle of claim 11 wherein the assessment arrangement is configured to determine when the first modem of the plurality of modems has a performance issue by determining whether an acknowledgement has been obtained on a first channel of the plurality of channels from the teleoperations system.

16. The vehicle of claim 11 wherein the plurality of modems includes a second modem, the first modem being associated with a first service provider, the second modem being associated with a second service provider.

17. The vehicle of claim 11 wherein the data includes a plurality of frames, each frame of the plurality of frames having a frame identifier (ID), and wherein each portion of the first plurality of portions includes portions of a first frame of the plurality of frames and the frame ID.

18. A method comprising:
identifying a first signal to be provided to a teleoperations system by a vehicle;
dividing the first signal into a first plurality of portions, wherein each portion is associated with a first amount of bandwidth;
providing the first plurality of portions to a plurality of modems for transmission from the vehicle to the teleoperations system;
transmitting the first plurality of portions to the teleoperations system using the plurality of modems and a plurality of channels, the plurality of channels being associated with the plurality of modems;
determining whether a first modem of the plurality of modems has obtained a first acknowledgement from the teleoperations system;
when it is determined that the first modem has not obtained the first acknowledgement from the teleoperations system, dividing the first signal into a second plurality of portions, wherein a first portion of the second plurality of portions is associated with a second amount of bandwidth and other portions of the second plurality of portions are associated with a third amount of bandwidth, the second amount of bandwidth being less than the third amount of bandwidth; and
transmitting the second plurality of portions to the teleoperations system using the plurality of modems and the plurality of channels, wherein the first portion is transmitted on a first channel of the plurality of channels, the first channel being associated with the first modem.

19. The method of claim 18 wherein the vehicle is an autonomous or semi-autonomous vehicle, and wherein the first signal includes sensor data obtained from a sensor on the vehicle.

20. The method of claim 2 wherein transmitting the second plurality of portions to the system using the plurality of modems and the plurality of channels includes transmitting the first portion using the first modem.

21. The method of claim 18 wherein the plurality of modems is associated with a plurality of service providers, and wherein the second amount of bandwidth is an approximately total amount of available bandwidth associated with the plurality of modems.

* * * * *